United States Patent
Ha et al.

(10) Patent No.: US 10,515,570 B2
(45) Date of Patent: Dec. 24, 2019

(54) FLEXIBLE DISPLAY DEVICE AND METHOD OF MANUFACTURING THE SAME

(71) Applicant: SAMSUNG DISPLAY CO., LTD., Yongin-si, Gyeonggi-Do (KR)

(72) Inventors: Seung-Hwa Ha, Hwaseong-si (KR); Junghun Lee, Hwaseong-si (KR); Kyuyoung Kim, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/242,218

(22) Filed: Jan. 8, 2019

(65) Prior Publication Data

US 2019/0259310 A1     Aug. 22, 2019

(30) Foreign Application Priority Data

Feb. 22, 2018    (KR) .................. 10-2018-0021139

(51) Int. Cl.
| | | |
|---|---|---|
| *G09F 9/30* | (2006.01) | |
| *H01L 51/00* | (2006.01) | |
| *H01L 51/56* | (2006.01) | |
| *H01L 51/50* | (2006.01) | |
| *H01L 51/52* | (2006.01) | |

(52) U.S. Cl.
CPC .......... *G09F 9/301* (2013.01); *H01L 51/0097* (2013.01); *H01L 51/5012* (2013.01); *H01L 51/5246* (2013.01); *H01L 51/56* (2013.01); *H01L 51/5256* (2013.01)

(58) Field of Classification Search
CPC . G09F 9/301; H01L 51/5246; H01L 51/5012; H01L 51/0097; H01L 51/56; H01L 51/5256
See application file for complete search history.

(56) References Cited

U.S. PATENT DOCUMENTS

| | | | |
|---|---|---|---|
| 9,276,055 B1 * | 3/2016 | Son | ..................... H01L 27/3276 |
| 9,923,156 B2 | 3/2018 | Jeong | |
| 10,056,446 B2 * | 8/2018 | Kim | ..................... G09G 3/3291 |
| 10,283,535 B2 * | 5/2019 | Saeki | .................. H01L 27/1262 |

(Continued)

FOREIGN PATENT DOCUMENTS

| | | |
|---|---|---|
| KR | 10-2017-0012739 | 2/2017 |
| KR | 10-2017-0061313 | 6/2017 |

*Primary Examiner* — Donald L Raleigh
(74) *Attorney, Agent, or Firm* — F. Chau & Associates, LLC

(57) ABSTRACT

A flexible display device includes a display panel that includes a bending area that is bendable about a bending axis that extends in a first direction and first and second non-bending areas spaced apart from each other in a second direction that intersects the first direction with the bending area interposed therebetween, and a support member under the display panel. The support member includes a first member that overlaps the bending area and that includes a first metal and a first bonding metal with different melting points, and a bonding member in contact with one side of the first member and that extends in the first direction. The bonding member includes the same metal as the first bonding metal. A concentration of the first bonding metal in the first member progressively decreases from the one side toward the bending axis.

21 Claims, 21 Drawing Sheets

(56) References Cited

U.S. PATENT DOCUMENTS

| | | | | |
|---|---|---|---|---|
| 2006/0150387 A1* | 7/2006 | Kobayashi | B23K 11/166 | 29/458 |
| 2013/0002583 A1* | 1/2013 | Jin | G06F 1/1637 | 345/173 |
| 2014/0002385 A1* | 1/2014 | Ka | G06F 1/1601 | 345/173 |
| 2014/0217382 A1* | 8/2014 | Kwon | H01L 51/0097 | 257/40 |
| 2014/0232956 A1* | 8/2014 | Kwon | G02F 1/133305 | 349/12 |
| 2014/0355195 A1* | 12/2014 | Kee | G06F 1/1616 | 361/679.27 |
| 2014/0363221 A1* | 12/2014 | Nakano | B23K 1/00 | 403/272 |
| 2015/0177789 A1* | 6/2015 | Jinbo | G06F 1/1652 | 313/511 |
| 2015/0287365 A1* | 10/2015 | Song | G09G 3/344 | 345/206 |
| 2015/0380679 A1* | 12/2015 | Fujiyoshi | H01L 51/5253 | 257/99 |
| 2016/0111485 A1* | 4/2016 | Chida | H01L 27/322 | 257/40 |
| 2016/0172428 A1* | 6/2016 | Song | H01L 27/3276 | 257/99 |
| 2016/0181345 A1* | 6/2016 | Lee | H01L 27/3276 | 257/40 |
| 2016/0199931 A1* | 7/2016 | Sjodin | B23K 35/3033 | |
| 2016/0308151 A1* | 10/2016 | Kim | H01L 51/0097 | |
| 2017/0040406 A1* | 2/2017 | Park | H01L 27/3276 | |
| 2017/0040562 A1* | 2/2017 | Kim | H01L 51/52 | |
| 2017/0121977 A1 | 5/2017 | Augustyniak | | |
| 2017/0233606 A1* | 8/2017 | Park | H01L 27/3244 | 428/327 |
| 2017/0263690 A1* | 9/2017 | Lee | G02F 1/133305 | |
| 2017/0330917 A1* | 11/2017 | Kim | G06F 3/0412 | |
| 2017/0358630 A1* | 12/2017 | Naijo | H01L 27/288 | |
| 2017/0371194 A1* | 12/2017 | Tomioka | G02F 1/133305 | |
| 2018/0076415 A1* | 3/2018 | Chung | G09G 3/3266 | |
| 2018/0097199 A1* | 4/2018 | Jo | H01L 51/5253 | |
| 2018/0108852 A1* | 4/2018 | Nishikawa | H01L 27/3276 | |
| 2018/0197935 A1* | 7/2018 | Yuan | H01L 27/3276 | |
| 2018/0217639 A1* | 8/2018 | Jones | G06F 1/1652 | |
| 2018/0315953 A1* | 11/2018 | Hu | G02F 1/133308 | |
| 2018/0337220 A1* | 11/2018 | Kim | H01L 27/3244 | |
| 2019/0005857 A1* | 1/2019 | Wakata | G09F 9/301 | |

* cited by examiner

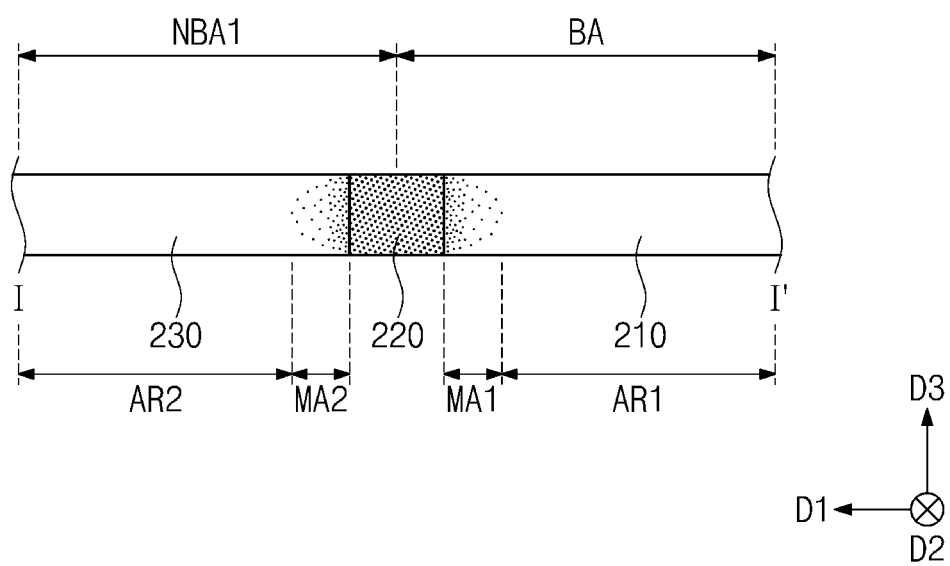

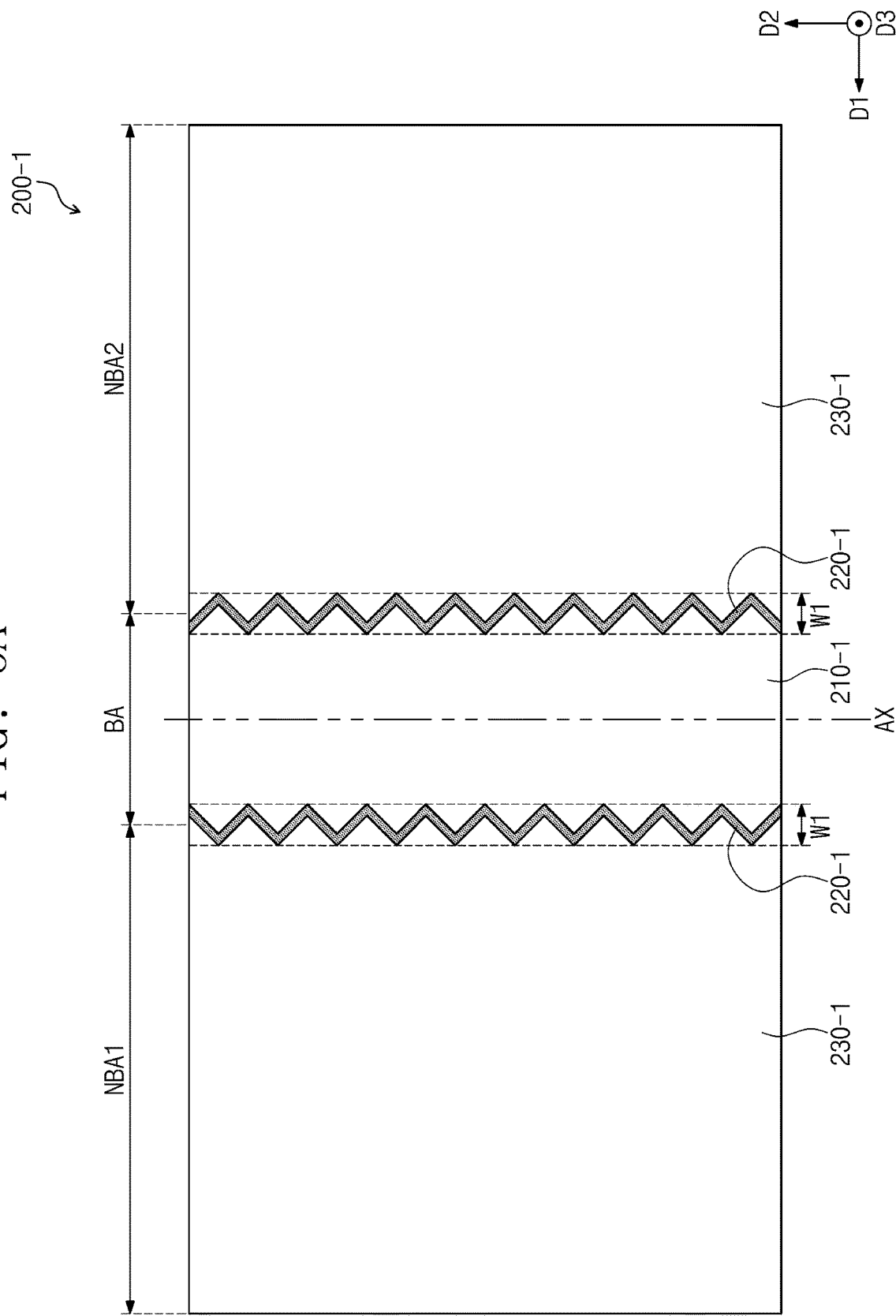

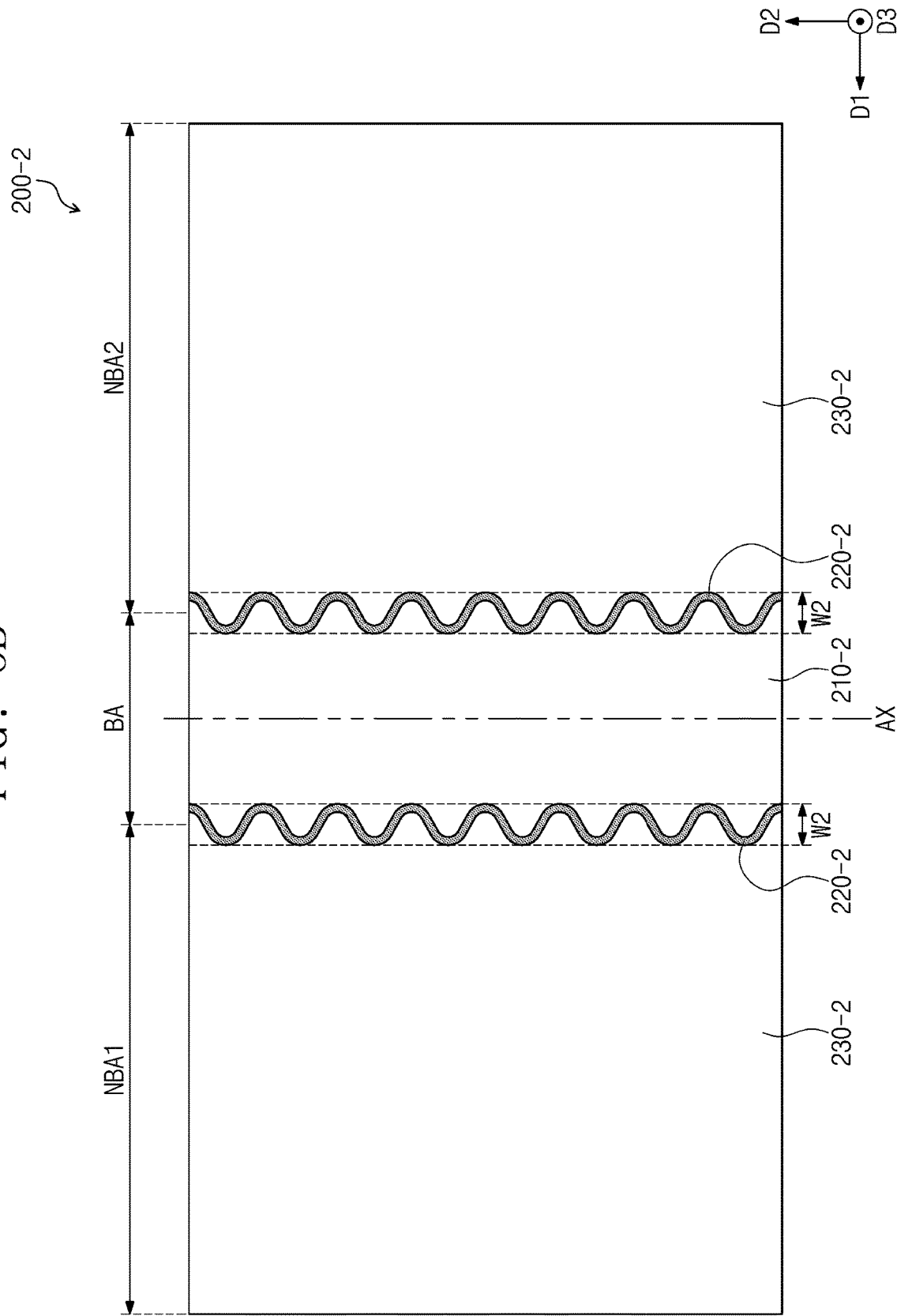

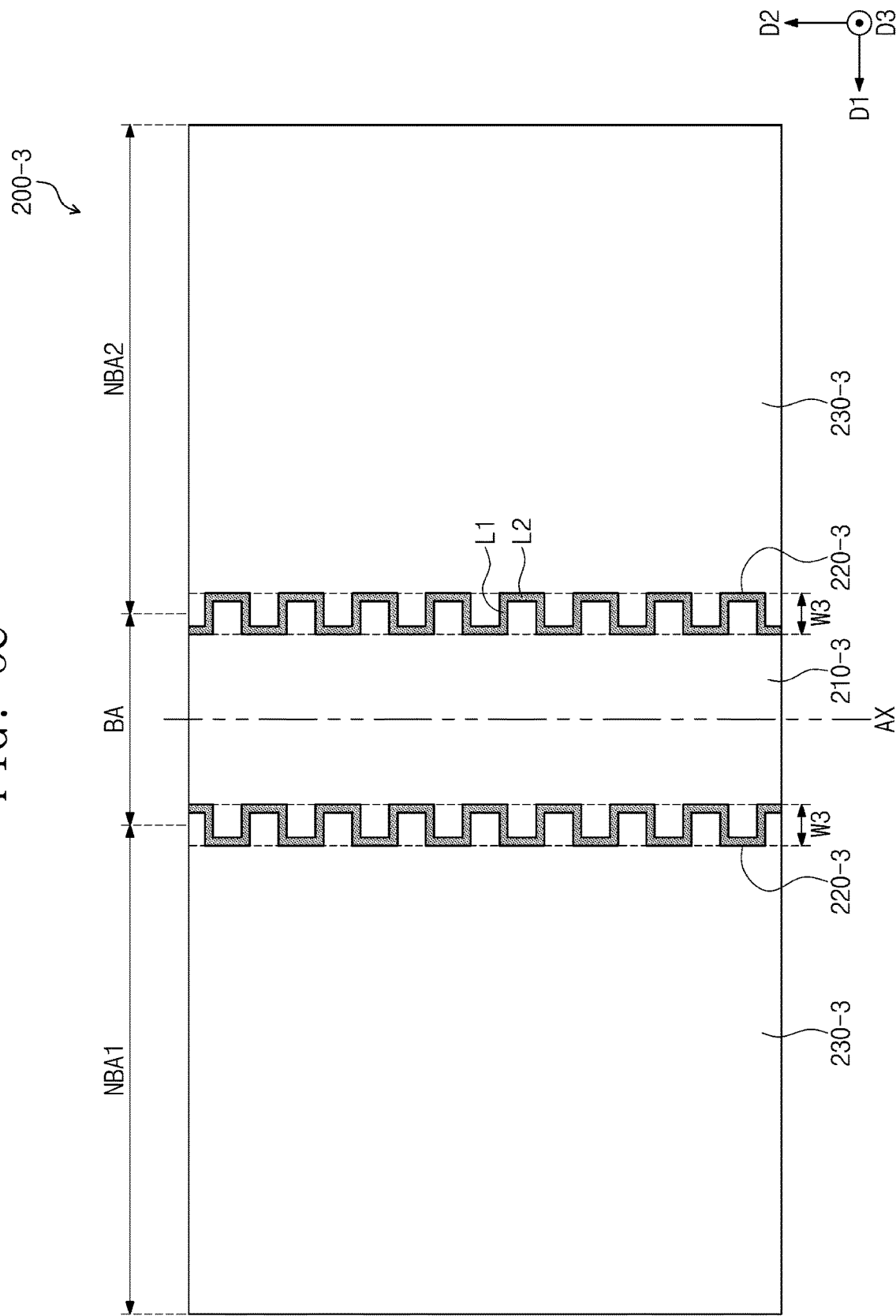

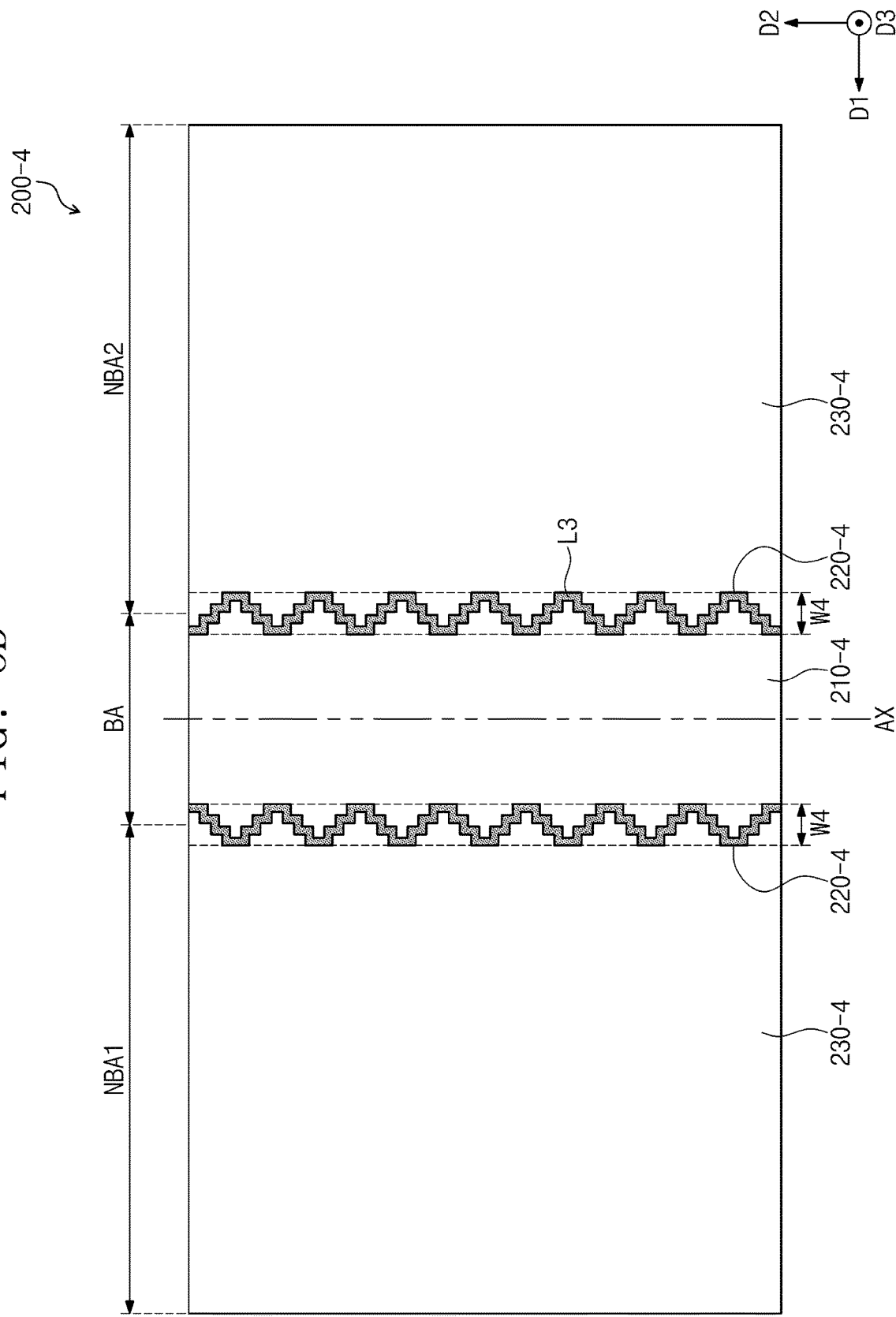

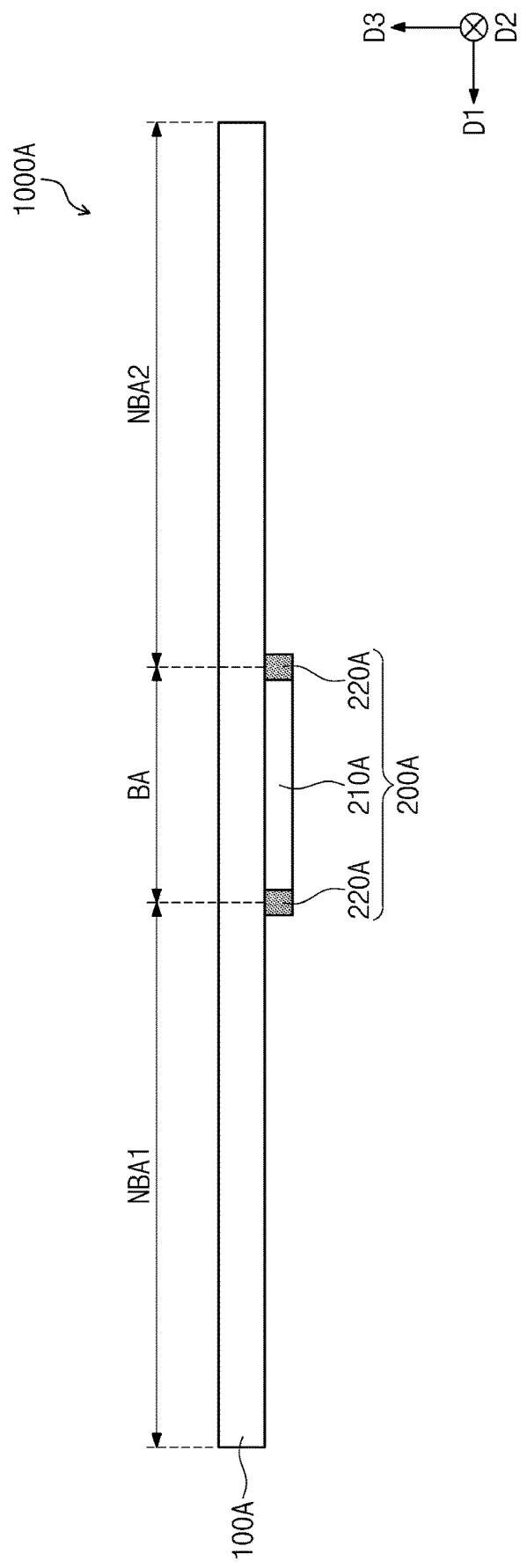

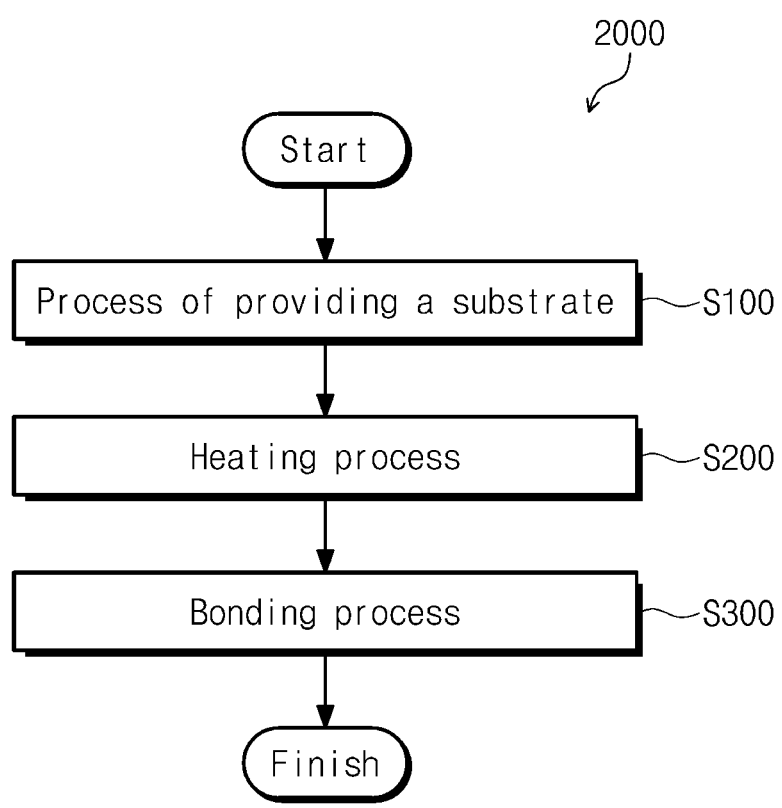

FLEXIBLE DISPLAY DEVICE AND METHOD OF MANUFACTURING THE SAME

CROSS-REFERENCE TO RELATED APPLICATION

This U.S. non-provisional patent application claims priority under 35 U.S.C. § 119 from, and the benefit of, Korean Patent Application No. 10-2018-0021139, filed on Feb. 22, 2018 in the Korean Intellectual Property Office, the contents of which are herein incorporated by reference in their entirety.

BACKGROUND

Embodiments of the present disclosure herein are directed to a display device, and more particularly, to a display device with improved reliability and a method of manufacturing the same.

Recently, bendable and/or foldable display devices, hereinafter referred to as 'flexible display devices', have been developed. A flexible display device includes a flexible display panel and various support members.

The support members may have different functions from each other. The support members are adhered to at least one of one surface or another surface of the flexible display panel by using an adhesive. The support members are bendable or foldable together with the flexible display panel.

SUMMARY

Embodiments of the present disclosure provide a flexible display device that can improve adhesive strength between an adhesive and a support member by disposing the support member, in which different metals are connected to each other, in a bendable area of a display panel which is bent a plurality of times, and a method of manufacturing the same.

In an embodiment of the inventive concepts, a flexible display device includes a display panel that includes a bending area that is bendable about a bending axis that extends in a first direction and a first non-bending area and a second non-bending area spaced apart from each other in a second direction that intersects the first direction with the bending area interposed therebetween, and a support member disposed under the display panel. The support member includes a first member that overlaps the bending area and that including a first metal and a first bonding metal with different melting points, and a bonding member in contact with one side of the first member and that extends in the first direction. The bonding member includes the same metal as the first bonding metal. A concentration of the first bonding metal in the first member progressively decreases from the one side toward the bending axis.

In an embodiment, the melting point of the first bonding metal is lower than the melting point of the first metal.

In an embodiment, the first metal includes at least one of a single metal or an alloy.

In an embodiment, the support member further includes a second member that overlaps at least one of the first and second non-bending areas and that is in contact with the bonding member. The second member includes a second bonding metal and a second metal, the second bonding metal is the same as the first bonding metal, and the second metal has a different melting point from the second bonding metal. A concentration of the second bonding metal in the second member decreases with increasing distance from the bending axis.

In an embodiment, the melting point of the second bonding metal is lower than the melting point of the second metal.

In an embodiment, the second member includes a metal whose thermal conductivity is greater than that of the first member.

In an embodiment, at least a portion of the first member includes an area formed only of the first metal, and at least a portion of the second member includes an area formed only of the second metal.

In an embodiment, the flexible display device further includes a functional layer disposed under the support member and that includes at least one of a cushion layer, a light blocking layer, or a heat dissipation layer.

In an embodiment, the display panel includes a base layer, a circuit layer disposed on the base layer and that includes a plurality of signal lines, an element layer that includes an organic light emitting element electrically connected to the circuit layer, and an encapsulation layer that covers the element layer.

In an embodiment, the bonding member has a shape that continuously extends back and forth in the second direction.

In an embodiment of the inventive concepts, a flexible display device includes a display panel that includes a bending area that is bendable about a bending axis that extends in a first direction and a first non-bending area and a second non-bending area spaced apart from each other in a second direction that intersects the first direction with the bending area interposed therebetween, and a support member disposed under the display panel. The support member includes a first member that overlaps the bending area and that includes a bonding metal and a first metal, a second member that overlapping with at least one of the first and second non-bending areas and that is spaced apart from the first member, and a bonding member that overlaps at least a portion of the bending area and at least a portion of the first and second non-bending areas. The second member includes the bonding metal and a second metal having a different melting point from the bonding metal, and the bonding member is disposed between the first member and the second member and includes the bonding metal. A shape of the bonding member has a pattern extends in the first direction.

In an embodiment, the melting point of the bonding metal is lower than those of the first metal and the second metal.

In an embodiment, the first member has a first modulus, and the second member has a second modulus less than the first modulus.

In an embodiment, a modulus of the bonding member gradually decreases from the first modulus to the second modulus with increasing distance from the bending axis in the second direction.

In an embodiment, the pattern oscillates back and forth in the second direction as the pattern extends in the first direction.

In an embodiment, the pattern is a sinusoidal or semicircular wave shape.

In an embodiment, the pattern has one of a zigzag shape, a square wave shape, or a stepped zigzag shape.

In an embodiment, a portion of an amplitude of the pattern overlaps a portion of each of the bending area and the first and second non-bending areas in the first direction when viewed in a plan view.

In an embodiment of the inventive concepts, a method of manufacturing a flexible display device includes disposing a first member that includes a first metal, and a second member spaced apart from the first member and that includes a second metal, applying heat to the first member and the second member, and disposing a molten bonding metal between the first member and the second member to bond the first member and the second member. At least a portion of the bonding metal permeates and diffuses into each of the first and second members.

In an embodiment, the molten bonding metal has a melting point that is less than those of the first member and the second member.

BRIEF DESCRIPTION OF THE DRAWINGS

FIG. 4B is a cross-sectional view of a support member according to an embodiment of the inventive concepts.

FIGS. 6A to 6D are plan views of support members according to some embodiments of the inventive concepts.

FIG. 7B is a cross-sectional view of some components of a flexible display device according to an embodiment of the inventive concepts.

FIG. 9 is a flowchart of a method of manufacturing a flexible display device according to an embodiment of the inventive concepts.

DETAILED DESCRIPTION OF EXEMPLARY EMBODIMENTS

Figure 1:
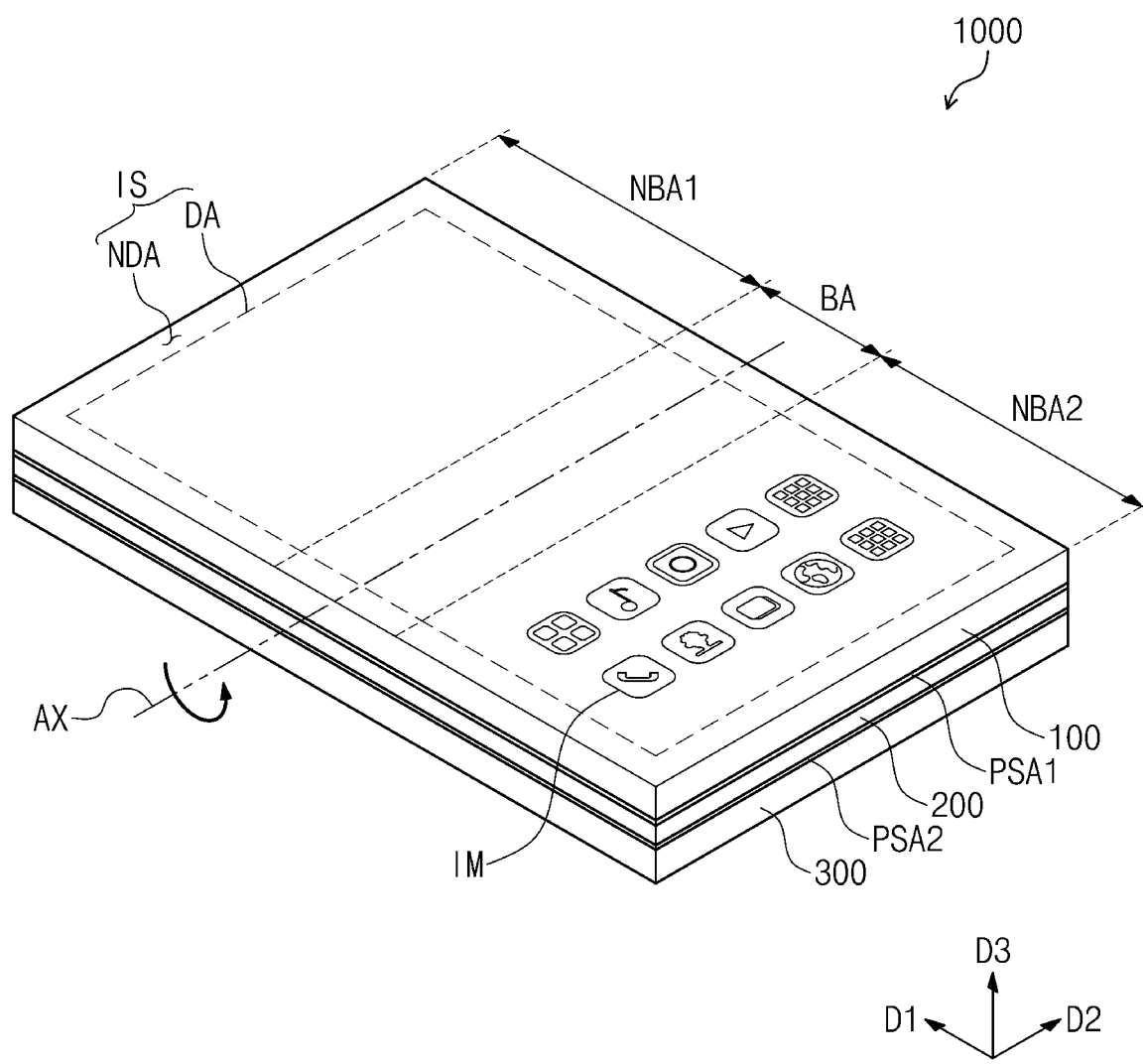
FIG. 1 is a perspective view of a flexible display device according to an embodiment of the inventive concepts.

Embodiments of the inventive concepts now will be described more fully hereinafter with reference to the accompanying drawings, in which various exemplary embodiments are shown. Embodiments of the inventive concepts may, however, take many different forms, and should not be construed as limited to exemplary embodiments set forth herein. Like reference numerals may refer to like elements throughout.

It will be understood that when an element such as a layer, region or substrate is referred to as being "on" another element, it can be directly on the other element or intervening elements may be present.

"About" or "approximately" as used herein is inclusive of the stated value and means within an acceptable range of deviation for the particular value as determined by one of ordinary skill in the art, considering the measurement in question and the error associated with measurement of the particular quantity, i.e., the limitations of the measurement system.

Hereinafter, exemplary embodiments of the inventive concepts will be described in detail with reference to the accompanying drawings.

Figure 2A:
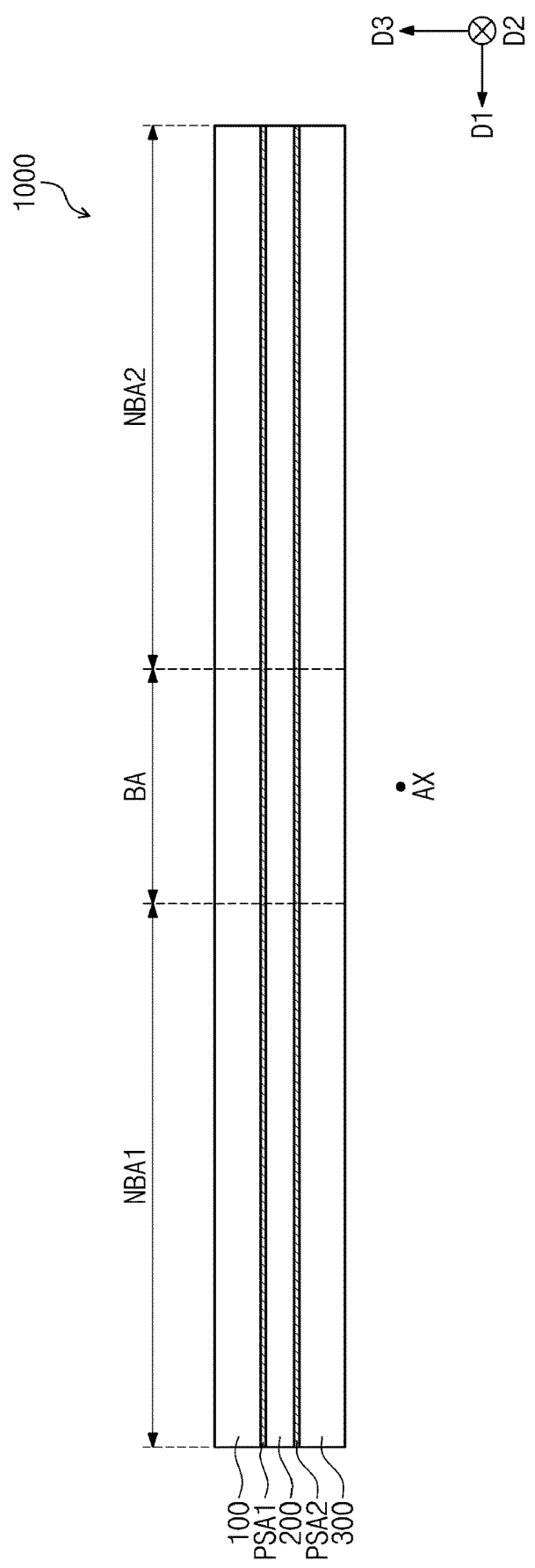
FIG. 2A is a cross-sectional view of a flexible display device according to an embodiment of the inventive concepts.
Figure 2B:
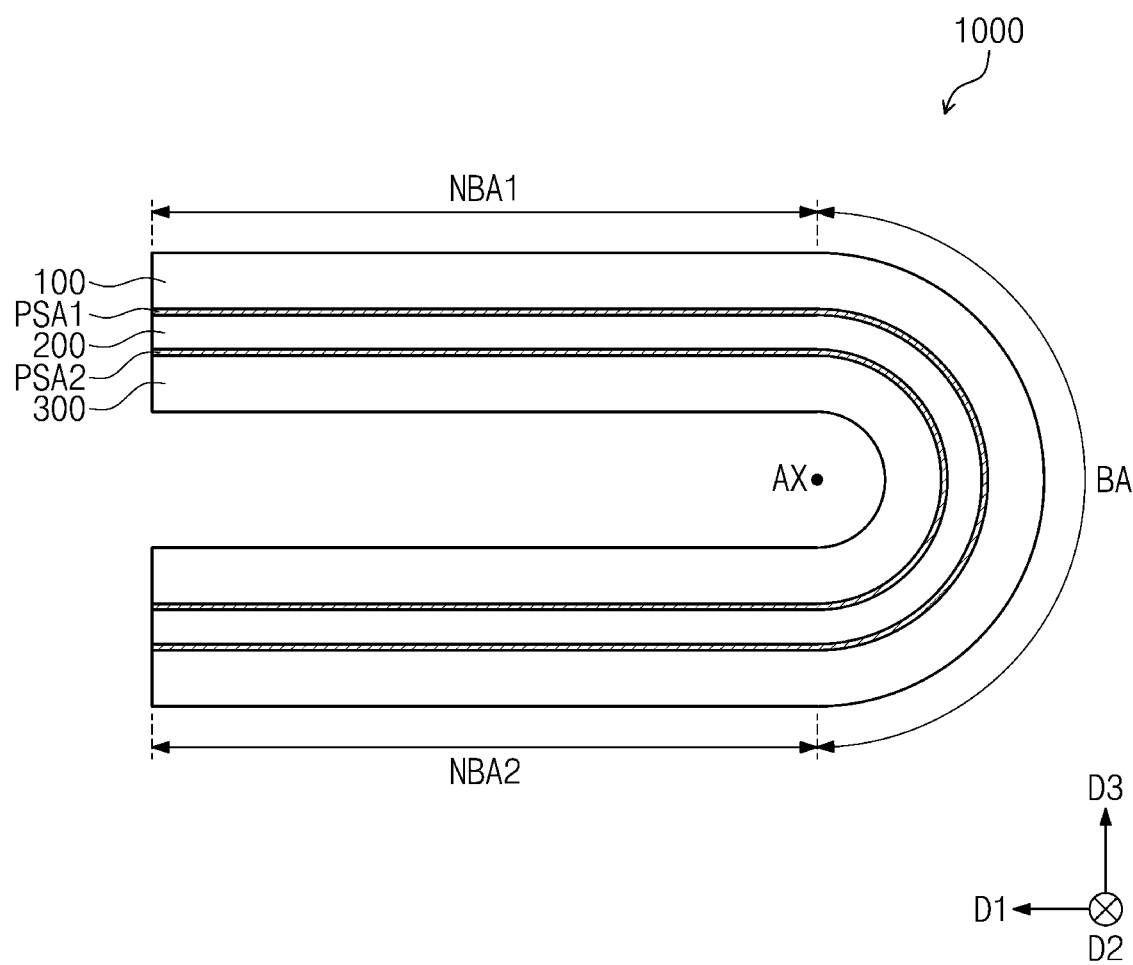
FIG. 2B is a cross-sectional view of a bent state of a flexible display device according to an embodiment of the inventive concepts.
Figure 3A:
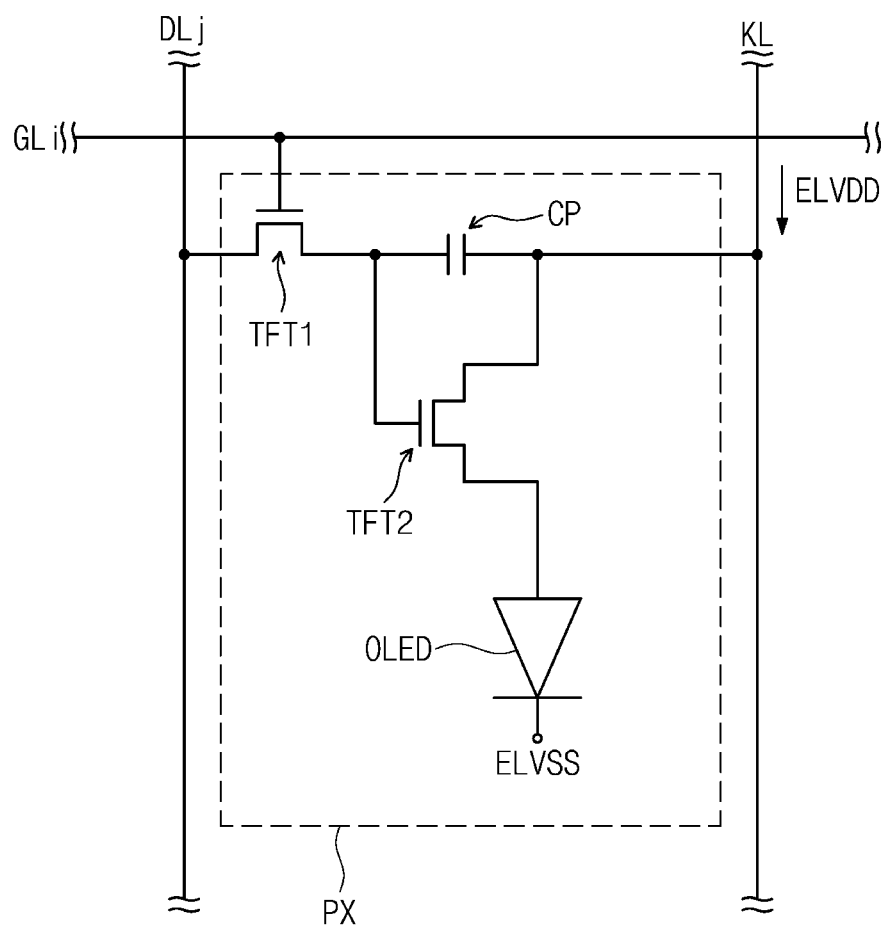
FIG. 3A is an equivalent circuit diagram of a pixel according to an embodiment of the inventive concepts.
Figure 3B:
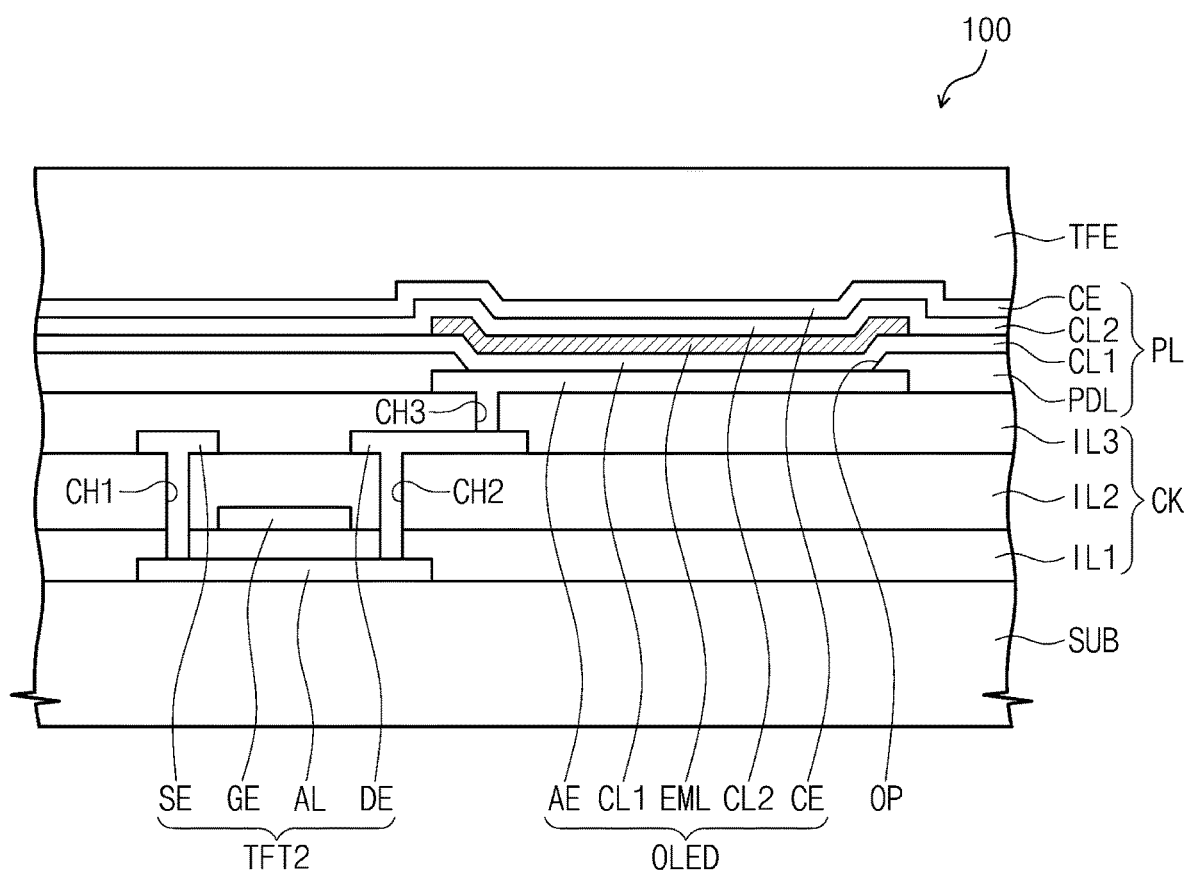
FIG. 3B is a cross-sectional view of a portion of a pixel according to an embodiment of the inventive concepts.

FIG. 1 is a perspective view of a flexible display device according to an embodiment of the inventive concepts. FIG. 2A is a cross-sectional view of a flexible display device according to an embodiment of the inventive concepts. FIG. 2B is a cross-sectional view of a bent state of a flexible display device according to an embodiment of the inventive concepts. FIG. 3A is an equivalent circuit diagram of a pixel according to an embodiment of the inventive concepts. FIG. 3B is a cross-sectional view of a portion of a pixel of a display panel according to an embodiment of the inventive concepts.

As illustrated in FIGS. 1, 2A and 2B, according to an embodiment, a flexible display device 1000 can display an image IM on a display surface IS parallel to a plane defined by a first direction D1 and a second direction D2 that intersects the first direction D1. The flexible display device 1000 displays the image IM in a third direction D3, and a user can obtain information from the image IM displayed on the display surface IS. In FIG. 1, icon images are illustrated as examples of the image IM. In a present embodiment, each of the first to third directions D1, D2 and D3 includes both directions. For example, the first direction D1 includes a direction parallel to the first direction D1 and a direction anti-parallel to, or opposite to, the first direction D1. However, embodiments of the inventive concepts are not limited thereto. Each of the first to third directions D1, D2 and D3 may be a single direction.

According to an embodiment, the flexible display device 1000 includes a plurality of areas. In detail, the flexible display device 1000 includes a bendable area BA that is bendable about a bending axis AX, a first non-bending area NBA1, and a second non-bending area NBA2. The first and second non-bending areas NBA1 and NBA2 are not bent. As illustrated in FIG. 2B, the flexible display device 1000 can be outer-bent such that the display surface IS is externally exposed. However, embodiments of the inventive concepts are not limited thereto. In another embodiment, the flexible display device 1000 is inner-bent such that the display surface IS of the first non-bending area NBA1 faces the display surface IS of the second non-bending area NBA2. In an embodiment of the inventive concepts, the flexible display device 1000 includes a plurality of bending areas BA. In an embodiment, the bending areas BA correspond to the manner in which a user operates the flexible display device 1000. For example, unlike FIGS. 1 and 2B, the bending area BA may be parallel to the first direction D1 or may be parallel to a diagonal direction. The bending area BA is not fixed but is determined by a radius of curvature.

According to an embodiment of the inventive concepts, the flexible display device 1000 can be bent or stretched about the bending axis AX. The bending axis AX is an imaginary line extending in the second direction D2, and the flexible display device 1000 can be bent as indicated by the arrow in FIG. 1 to surround the bending axis AX.

For example, according to an embodiment, as illustrated in FIG. 1, the flexible display device 1000 can be stretched in a first mode. The first mode corresponds to a specific state in which the flexible display device 1000 is unfolded or stretched out.

According to an embodiment of the inventive concepts, the flexible display device 1000 has a bent shape in a second mode. The second mode corresponds to a state different from the first mode and refers to a state in which the flexible display device 1000 is bent.

According to an embodiment, the flexible display device 1000 includes a display panel 100, a support member 200, and a functional layer 300.

According to an embodiment, the display panel 100 generates and displays the image IM from electrical signals. The display surface IS is defined by the display panel 100. The display surface IS includes a display area DA in which the image IM is displayed, and a non-display area NDA adjacent to the display area DA. The non-display area NDA is an area in which no image IM is displayed. The non-display area NDA surrounds the display area DA when viewed in a plan view. However, embodiments of the inventive concepts are not limited thereto.

FIG. 1 illustrates an embodiment in which the display surface IS is normal to the third direction D3. However, embodiments of the inventive concepts are not limited thereto. In other embodiments, the display surface IS normal to a direction opposite to the third direction D3, or the display panel 100 displays images through both surfaces. The display panel 100 may be a liquid crystal display panel, an organic light emitting display panel, or an electrowetting display panel. In a present embodiment, an organic light emitting display panel will be described as an example of the display panel 100.

The display panel 100 will be described in detail with reference to FIGS. 3A and 3B. According to an embodiment, the display panel 100 includes a base layer SUB, a pixel PX, and a thin film encapsulation layer TFE. The pixel PX includes a circuit layer CK and an element layer PL that includes an organic light emitting element OLED.

According to an embodiment, the pixel PX receives a gate signal from an $i^{th}$ gate line GLi and receives a data signal from a $j^{th}$ data line DLj. The pixel PX receives a first power source voltage ELVDD from a power line KL.

According to an embodiment, the pixel PX include the organic light emitting element OLED as a display element. The pixel PX further includes a first transistor TFT1, a capacitor CP and a second transistor TFT2, which constitute a circuit part for driving the organic light emitting element OLED.

According to an embodiment, the first transistor TFT1 outputs the data signal, received from the $j^{th}$ data line DLj, in response to the gate signal received from the $i^{th}$ gate line GLi.

According to an embodiment, the capacitor CP is charged with a voltage that corresponds to the data signal received from the first transistor TFT1. The capacitor CP has a plurality of insulating layers in the pixel PX. For example, two electrodes of the capacitor CP are respectively disposed on different insulating layers of the plurality of insulating layers.

According to an embodiment, the second transistor TFT2 is connected to the organic light emitting element OLED, which outputs a voltage ELVSS. The second transistor TFT2 controls a driving current that flows through the organic light emitting element OLED in response to the amount of charge stored in the capacitor CP. The organic light emitting element OLED emits light during a turned-on period of the second transistor TFT2. However, configurations of the pixel PX are not limited thereto and can be variously modified.

According to an embodiment, the circuit layer CK includes the first transistor TFT1, the second transistor TFT2, and a plurality of insulating layers IL1, IL2 and IL3.

The element layer PL includes a pixel defining layer PDL and the organic light emitting element OLED. The first transistor TFT1 is substantially similar in structure to the second transistor TFT2, and detailed descriptions of the first transistor TFT1 will be omitted for the purpose of ease and convenience in description and illustration.

According to an embodiment, the base layer SUB is a flexible insulator. For example, the base layer SUB may be a plastic substrate or a polymer film.

According to an embodiment, a semiconductor pattern AL of the second transistor TFT2 and a first insulating layer IL1 are disposed on the base layer SUB. The first insulating layer IL1 covers the semiconductor pattern AL.

According to an embodiment, a control electrode GE of the second transistor TFT2 and a second insulating layer IL2 are disposed on the first insulating layer IL1. The second insulating layer IL2 covers the control electrode GE. Each of the first and second insulating layers IL1 and IL2 include an organic layer or an inorganic layer. Each of the first and second insulating layers IL1 and IL2 include a plurality of thin layers.

According to an embodiment, an input electrode SE and an output electrode DE of the second transistor TFT2 and a third insulating layer IL3 are disposed on the second insulating layer IL2. The third insulating layer IL3 covers the input electrode SE and the output electrode DE.

According to an embodiment, the input electrode SE and the output electrode DE are connected to portions of the semiconductor pattern AL through a first through-hole CH1 and a second through-hole CH2, respectively, that penetrate the first and second insulating layers IL1 and IL2. However, embodiments of the inventive concepts are not limited thereto. In other embodiments, the layers on which the electrodes GE, SE and DE and the semiconductor pattern AL are disposed can vary, and the input electrode SE and the output electrode DE can be connected directly to the semiconductor pattern AL without through-holes. The second transistor TFT2 according to embodiments of the inventive concepts can have any of various structures and is not limited to a specific embodiment.

According to an embodiment, the organic light emitting element OLED and the pixel defining layer PDL are disposed on the third insulating layer IL3. The pixel defining layer PDL has an opening OP that overlaps the organic light emitting element OLED. The opening OP of the pixel defining layer PDL defines a light emitting area.

According to an embodiment, the organic light emitting element OLED includes an anode electrode AE, an emission pattern EML, a cathode electrode CE, a hole transfer region CL1 disposed between the anode electrode AE and the emission pattern EML, and an electron transfer region CL2 disposed between the emission pattern EML and the cathode electrode CE. A plurality of organic light emitting elements OLED are provided, and the plurality of organic light emitting elements OLED overlap a plurality of the light emitting areas, respectively.

According to an embodiment, the anode electrode AE is disposed on the third insulating layer IL3, and the pixel defining layer PDL is disposed on an edge portion of the anode electrode AE. The opening OP of the pixel defining layer PDL exposes at least a portion of the anode electrode AE. In addition, the anode electrode AE is connected to the output electrode DE through a third through-hole CH3 that penetrates the third insulating layer IL3.

According to an embodiment, the hole transfer region CL1 is disposed on the anode electrode AE and covers the anode electrode AE and the pixel defining layer PDL. The hole transfer region CL1 includes at least one of a hole injection layer, a hole transfer layer, or a single layer having both a hole injection function and a hole transfer function.

According to an embodiment, the emission pattern EML is disposed on the hole transfer region CL1 and in the opening OP. A plurality of emission patterns EML are provided, and the plurality of emission patterns EML overlap the light emitting areas, respectively. The emission pattern EML includes a fluorescent material or a phosphorescent material. The emission pattern EML generates red, green or blue light, or may generate light that is a mixture of at least two of the colors.

According to an embodiment, the electron transfer region CL2 is disposed on the emission pattern EML. The cathode electrode CE is disposed on the electron transfer region CL2 opposite to the anode electrode AE. The cathode electrode CE is formed of a material having a low work function to easily inject electrons. However, embodiments of the inventive concepts are not limited thereto. In another embodiment, the positions of the anode electrode AE and the cathode electrode CE can be interchanged in the organic light emitting element OLED. In some embodiments, the structure of the organic light emitting element OLED can vary and is not limited to one embodiment.

According to an embodiment, the thin film encapsulation layer TFE is disposed on the cathode electrode CE. The thin film encapsulation layer TFE covers an entire surface of the cathode electrode CE and encapsulates the organic light emitting element OLED. The thin film encapsulation layer TFE has a thickness from about 1 µm to about 10 µm. The thin film encapsulation layer TFE includes a plurality of inorganic layers or organic layers. The inorganic layers and the organic layers are alternately stacked. The inorganic layer protects the organic light emitting element OLED from moisture/oxygen. The inorganic layer includes a silicon nitride layer, a silicon oxynitride layer, a silicon oxide layer, a titanium oxide layer, or an aluminum oxide layer. The organic layer protects the organic light emitting element OLED from foreign materials such as dust particles. The organic layer may include, but is not limited to, an acrylic-based organic layer.

Referring again to FIG. 1, according to an embodiment, the support member 200 is disposed under the display panel 100. When the flexible display device 1000 is bent into the second mode, the support member 200 supports the bent display panel 100. The support member 200 includes one or more metals. Thus, the support member 200 that overlaps the bending area BA can be formed of a metal having a restoring force with respect to an externally applied tensile force.

Figure 8:
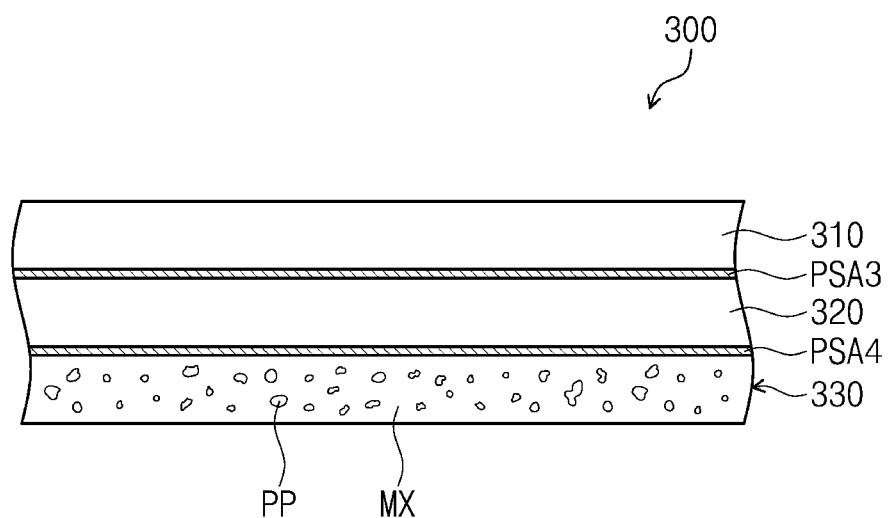
FIG. 8 is a cross-sectional view of a functional layer according to an embodiment of the inventive concepts.

According to an embodiment, the functional layer 300 is disposed under the support member 200. The functional layer 300 includes a plurality of layers, as shown in FIG. 8. The functional layer 300 protects the display panel 100 and includes various layers that supplement the display panel 100. For example, the functional layer 300 can include a cushion layer that has a foam shape that absorbs impacts to the display panel 100, a light blocking layer that blocks light received from the display panel 100, or a heat dissipation layer that discharges heat generated by the display panel 100. The support member 200 and the functional layer 300 will be described below in more detail.

According to an embodiment, the flexible display device 1000 further includes at least one adhesive layer. The flexible display device 1000 includes a first adhesive layer PSA1 disposed between the display panel 100 and the support member 200, and a second adhesive layer PSA2 disposed between the support member 200 and the functional layer 300. The first adhesive layer PSA1 physically couples the display panel 100 and the support member 200 to each other, and the second adhesive layer PSA2 physically couples the support member 200 and the functional layer 300 to each other. Each of the adhesive layers PSA1 and PSA2 is formed by applying and hardening a liquid adhesive material or is a separately formed adhesive sheet. For example, each of the adhesive layers PSA1 and PSA2 may be formed of a pressure sensitive adhesive (PSA), an optical clear adhesive (OCA), or an optical clear resin (OCR).

According to an embodiment, the flexible display device 1000 further includes a window member. The window member covers the display panel 100. The window member is optically transparent. The window member protects the display panel 100 from external impacts and the external environment. The window member includes a flexible material. For example, the window member may be a polymer film or a plastic substrate.

Figure 4A:
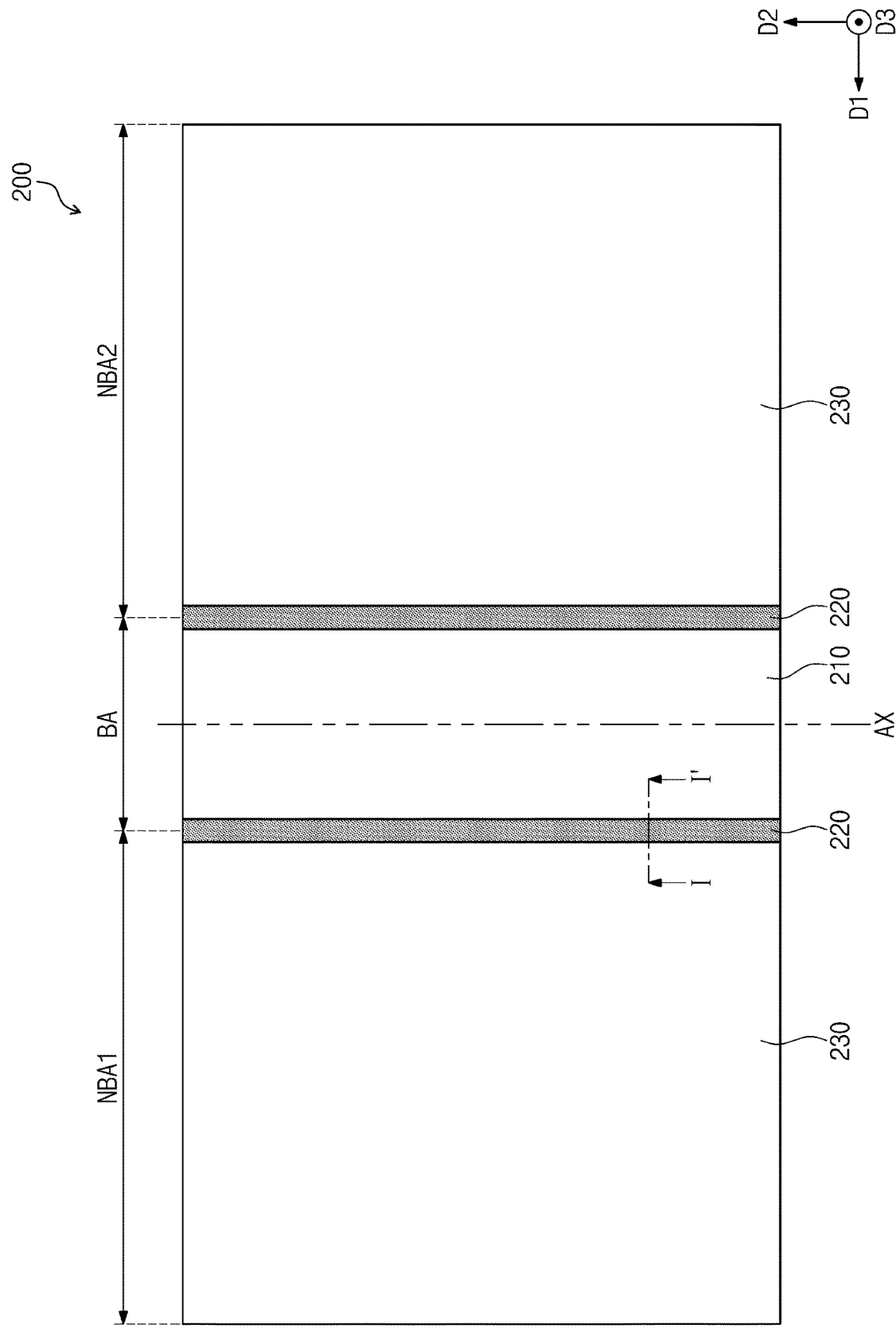
FIG. 4A is a plan view of a support member according to an embodiment of the inventive concepts.

FIG. 4A is a plan view of a support member according to an embodiment of the inventive concepts. FIG. 4B is a cross-sectional view of a support member according to an embodiment of the inventive concepts. Referring to FIG. 4A, the support member 200 includes a first member 210, a bonding member 220, and a second member 230.

According to an embodiment, the first member 210 is disposed in the bending area BA. The first member 210 overlaps the bending axis AX when viewed in a plan view. The first member 210 includes a first metal. The first metal is a main content in the first member 210. The first metal may include a single metal, i.e., be a pure metal, or may be an alloy such as stainless steel or invar.

According to an embodiment, the first metal has a predetermined restoring force. Since the first member 210 has a predetermined restoring force, the flexible display device 1000 can be repeatedly folded without the deterioration of the life span and reliability of the display panel 100 caused by folding stress. When a metal is brittle, the metal can be broken by a strong tensile force. However, a brittle metal may have a stronger restoring force than highly ductile metal. Thus, the first member 210 includes a metal that is more brittle than a material of the second member 230, which will be described below.

For example, in a present embodiment, when the first member 210 includes an alloy such as steel or invar, the first metal is iron.

According to an embodiment, the second member 230 is disposed in the non-bending area NBA1 and NBA2. The second member 230 is spaced apart from the first member 210 with the bonding member 220 interposed therebetween. The second member 230 is disposed adjacent to the bonding member 220. The second member 230 is in contact with one side of the bonding member 220. In a present embodiment, there are a plurality of second members 230, and the second members 230 are spaced apart from each other in the first direction D1 with the first member 210 interposed therebetween. There are a plurality of bonding members 220, and each of the second members 230 is in contact with one side of each of the bonding members 220. However, embodiments of the inventive concepts are not limited thereto. In another embodiment, one second member 230 may overlaps one of the non-bending areas NBA1 and NBA2.

According to an embodiment, the second member 230 includes a second metal. The second metal is a main content in the second member 230. The second metal may be a single metal, such as a pure metal, or may be an alloy. The second metal includes a thermally conducting metal. For example, the second metal includes copper (Cu).

According to an embodiment, the bonding member 220 overlaps with at least a portion of the bending area BA and at least a portion of the non-bending areas NBA1 or NBA2. The bonding member 220 is in contact with one side of the first member 210. In a present embodiment, there are a plurality of bonding members 220, and the bonding members 220 are spaced apart from each other in the first direction D1 with the first member 210 interposed therebetween. The bonding members 220 are respectively in contact with one side and another side of the first member 210, which are opposite to each other in the first direction D1. However, embodiments of the inventive concepts are not limited thereto. In another embodiment, a single bonding member 220 is in contact with one of both sides of the first member 210.

According to an embodiment, the bonding member 220 includes a bonding metal. The bonding metal has a melting point lower than those of the first metal and the second metal. For example, when the first metal is iron or invar and the second metal is copper, the bonding metal includes nickel (Ni). However, embodiments of the inventive concepts are not limited thereto. The bonding metal may include at least one other metal whose melting point is lower than those of the first and second metals.

A content of the bonding metal in each area is schematically illustrated in FIG. 4B. According to a present embodiment, the first member 210 furthers include the bonding metal. Since the bonding member 220 is in contact with and bonded to one side of the first member 210, at least a portion of the bonding metal of the bonding member 220 diffuses into the first member 210. Thus, as illustrated in FIG. 4B, the first member 210 includes a first area AR1 in which no bonding metal is present, and a first mixture area MA1 in which the first metal and the bonding metal are mixed with each other. The first area AR1 and the first mixture area MA1 are arranged in the first direction D1.

According to an embodiment, a content of the bonding metal in the first member 210 decreases with decreasing distance from the bending axis AX. In detail, a concentration of the bonding metal in the first member 210 is highest at the one side of the first member 210 that is in contact with the bonding member 220, and progressively decreases from the one side of the first member 210 toward the bending axis AX.

According to a present embodiment, the second member 230 further includes the bonding metal. The second member 230 includes a second area AR2 in which no bonding metal is present, and a second mixture area MA2 in which the second metal and the bonding metal are mixed with each other. The second mixture area MA2 and the second area AR2 are arranged in the first direction D1.

According to an embodiment, a content of the bonding metal in the second member 230 decreases with increasing distance from the bending axis AX. In detail, a concentration of the bonding metal in the second member 230 is highest at the one side of the second member 230 that is in contact with the bonding member 220, and decreases with increasing distance from the one side of the second member 230 in the first direction D1.

According to an embodiment of the inventive concepts, the first member 210, the bonding member 220 and the second member 230 are bonded to each other by a brazing method. At this time, the relatively low melting point bonding metal diffuses into the first member 210 and the second member 230. Thus, the concentration of the bonding metal in the first member 210 progressively decreases from an edge in contact with the bonding member 220 toward a center farthest from the bonding member 220.

As described above, according to an embodiment, the second member 230 and the bonding member 220 are bonded to each other by the same method. Thus, the concentration of the bonding metal in the second member 230 progressively decreases with increasing distance from an edge in contact with the bonding member 220.

According to an embodiment, the bonding member 220 overlaps at least a portion of the bending area BA and at least a portion of the non-bending areas NBA1 and NBA2. Thus, the mixture areas MA1 and MA2 are formed adjacent to the bending area BA and the non-bending areas NBA1 and NBA2. According to an embodiment of the inventive concepts, since the mixture areas MA1 and MA2 are formed adjacent to the bending area BA and the non-bending areas NBA1 and NBA2, it is possible to prevent a brittleness or modulus from changing between the bending area BA and the non-bending area NBA1 or NBA2. In addition, according to an embodiment of the inventive concepts, the first member 210 of the bending area BA is bonded to the second member 230 of the non-bending areas NBA1 and NBA2 through the bonding member 220, and thus different metals are disposed in different areas of the support member 200, respectively. As a result, a metal having a high restoring force and a high yield strength with respect to a tensile force is locally disposed in the bending area BA, and a metal that is less expensive than the metal of the bending area BA is disposed in the non-bending areas NBA1 and NBA2. Accordingly, the occurrence of wrinkles or interlayer delamination by stress can be reduced or prevented, the reliability of the flexible display device 1000 is improved, and a cost of processing a flexible display device 1000 is reduced.

Figure 5:
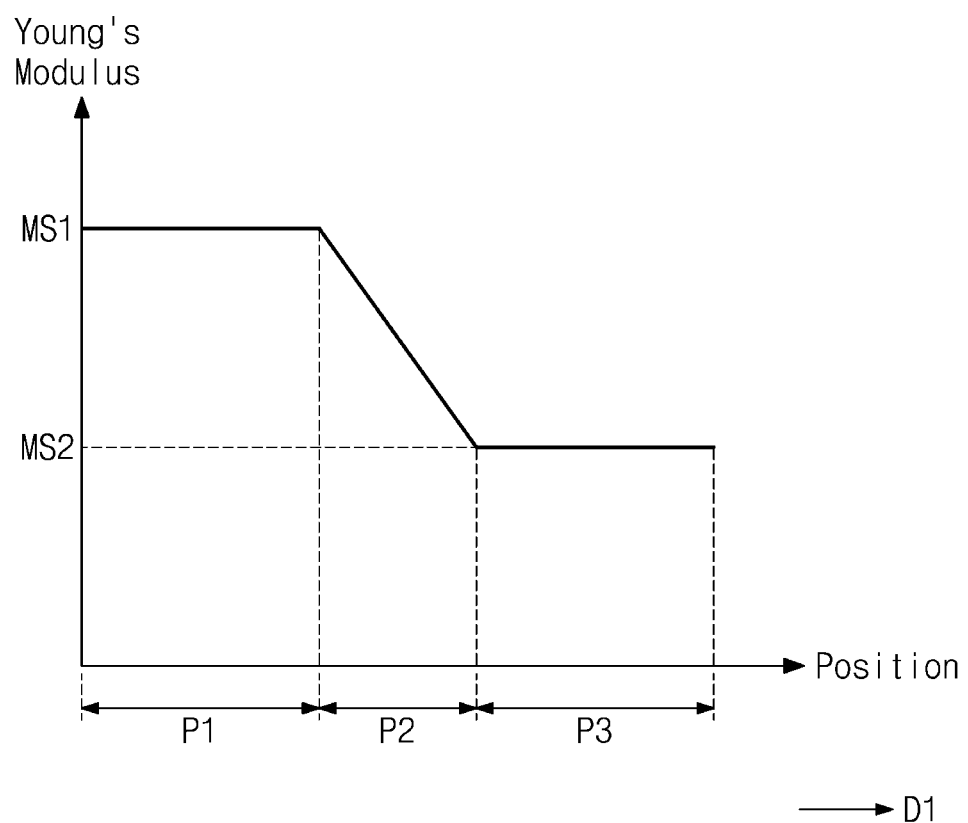
FIG. 5 is a graph of a Young's modulus change of a support member as a function of position, according to an embodiment of the inventive concepts.

FIG. 5 shows a change in modulus of the support member 200 as a function of position. According to an embodiment of the inventive concepts, the first metal of the first member 210 and the second metal of the second member 230 have a first Young's modulus MS1 and a second Young's modulus MS2, respectively. The first modulus MS1 of the first member 210 is greater than the second modulus MS2 of the second member 230.

In an X-axis of the graph of FIG. 5, a first section P1 corresponds to the first area AR1, and a second section P2 corresponds to the first mixture area MA1, the bonding member 220 and the second mixture area MA2. In addition, a third section P3 corresponds to the second area AR2. A Y-axis of the graph shows the moduli of the metals corresponding to the sections, respectively.

According to an embodiment, since portions of the bonding member 220 are included in the bending area BA and the non-bending area NBA1, the modulus of the second section P2 gradually and continuously changes from the first modulus MS1 to the second modulus MS2, unlike a sharp, discontinuous change between the modulus of different metals.

The support member 200 according to an embodiment of the inventive concepts has a modulus that gradually changes in the bonding member 220 between the first member 210 that overlaps the bending area BA and the second member 230 that overlaps the non-bending areas NBA1 and NBA2, and thus the occurrence of wrinkles or interlayer delaminations caused by a discontinuous physical property change can be prevented. As a result, the reliability of the flexible display device 1000 can be improved.

FIGS. 6A to 6D are plan views of support members according to embodiments of the inventive concepts. Referring to FIG. 6A, a bonding member 220-1 is disposed between a first member 210-1 and a second member 230-1 to bond the first member 210-1 to the second member 230-1. Contact surfaces of the first and second members 210-1 and 230-1 in contact with the bonding member 220-1 have substantially the same shape as the bonding member 220-1 when viewed in a plan view.

In a present embodiment, the bonding member 220-1 extends in the second direction D2 when viewed in a plan view. In a present embodiment, the bonding member 220-1 zigzags back and forth in the first direction D1 as it extends in the second direction D2.

According to an embodiment, an amplitude of the zigzag shape of the bonding member 220-1 in the first direction D1 is a first width W1. A portion of the first width W1 extends into the bending area BA, and another portion of the first width W1 extends into the non-bending areas NBA1 and NBA2.

Referring to FIG. 6B, according to an embodiment, a bonding member 220-2 has a substantially sinusoidal or semicircular wave shape that oscillates in the first direction D1 and extends in the second direction D2.

According to an embodiment, an amplitude of the bonding member 220-2 in the first direction D1 is a second width W2. A portion of the second width W2 extends into the bending area BA, and another portion of the second width W2 extends into the non-bending areas NBA1 and NBA2.

Referring to FIG. 6C, according to an embodiment, a bonding member 220-3 has a substantially square wave shape that oscillates in the first direction D1 and extends in the second direction D2. Thus, the shape of the square wave includes a plurality of first patterns L1 extending in the first direction D1 and a plurality of second patterns L2 extending in the second direction D2. However, embodiments of the inventive concepts are not limited thereto. In another embodiment, the shape of the wave may be that of another polygonal shape such as a trapezoid shape.

Referring to FIG. 6D, a bonding member 220-4 has a stepped zigzag shape that extends in the second direction D2 and zigzags back and forth in the first direction D1. The bonding member 220-4 includes a plurality of third patterns L3 arranged in a zigzag form in the second direction D2.

The bonding members 220-1, 220-2, 220-3 and 220-4 illustrated in FIGS. 6A to 6D have shapes regularly arranged in the second direction D2 and that extend back and forth in the first direction D1. However, embodiments of the inventive concepts are not limited thereto. In other embodiments, the amplitudes of each of the bonding members in the first direction D1 may vary along the second direction D2, or the patterns of each of the bonding members may be irregularly arranged in the second direction D2.

In support members according to embodiments of the inventive concepts, a modulus gradually changes between different metals in a plan view. Thus, it is possible to prevent the support members from being broken by tensile force applied thereto in a bending operation.

Figure 7A:
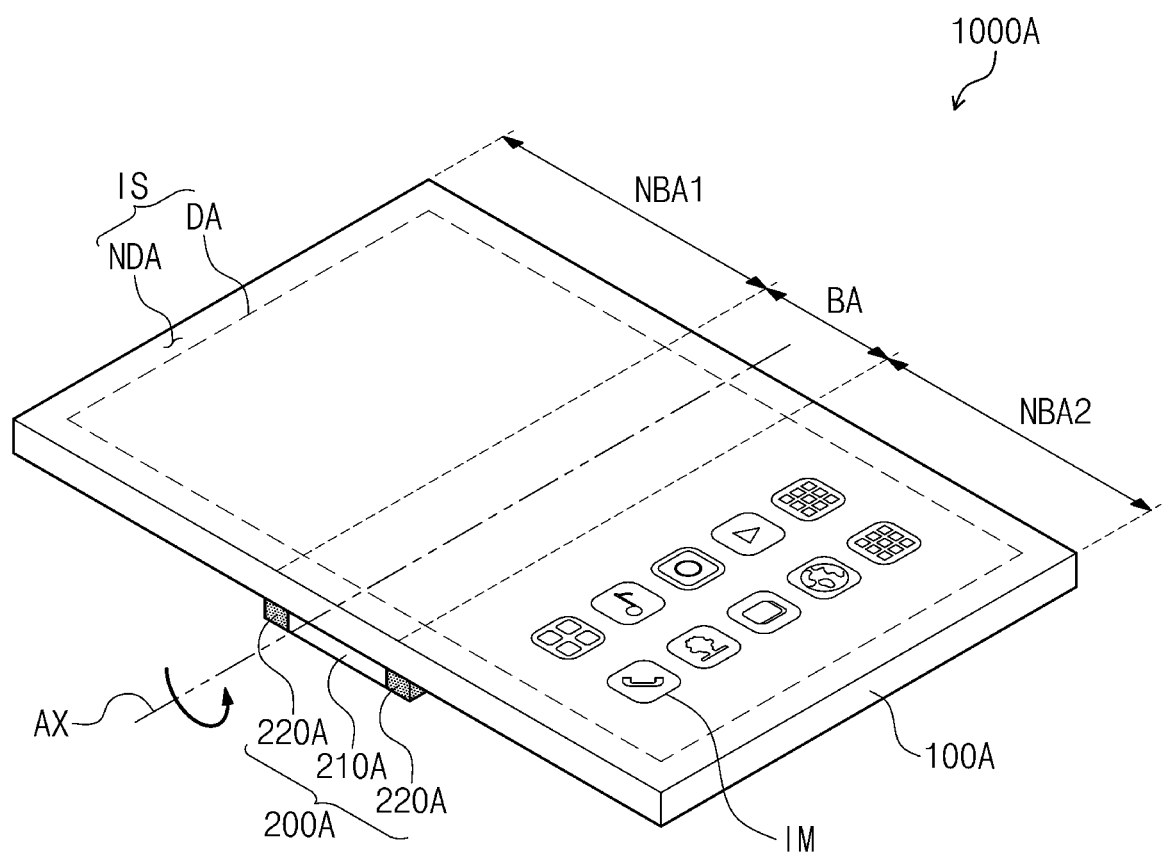
FIG. 7A is a perspective view of some components of a flexible display device according to an embodiment of the inventive concepts.

FIG. 7A is a perspective view of some components of a flexible display device according to an embodiment of the inventive concepts. FIG. 7B is a cross-sectional view of some components of a flexible display device according to an embodiment of the inventive concepts. Hereinafter, components that correspond to the components of FIGS. 1, 2A and 2B will be indicated by similar reference designators, and the descriptions of the same features as mentioned above will be omitted.

According to an embodiment, a flexible display device 1000A includes a display panel 100A and a support member 200A.

According to an embodiment, the support member 200A includes a first member 210A and bonding members 220A. Unlike the support member 200 illustrated in FIG. 4A, the bonding member 220A is in contact with only the first member 210A of the support member 200A, and the second member 230 of FIG. 4A is omitted in the flexible display device 1000A.

According to an embodiment, there are a plurality of bonding members 220A, and the bonding members 220A are spaced apart from each other in the first direction D1 with the first member 210A interposed therebetween. The bonding members 220A are respectively in contact with one side and another side of the first member 210A that are opposite to each other in the first direction D1.

According to an embodiment, the first member 210A overlaps the bending area BA of the flexible display device 1000A. The first member 210A supports the display panel 100A in a bending operation. The first member 210A may include a single metal, such as a pure metal, or an alloy. The bonding member 220A overlaps at least a portion of the bending area BA and at least a portion of the non-bending areas NBA1 and NBA2. The bonding member 220A includes a material that can strongly bond metals or a metal and a non-metal.

According to an embodiment, members that support the display panel 100A overlap the non-bending areas NBA1 and NBA2. Surfaces of the support members of the display panel 100A are not limited to a specific shape or a specific material.

According to a present embodiment, a high restoring force metal is locally disposed in the bending area BA, which can reduce a process cost and prevent an interlayer delamination phenomenon.

FIG. 8 is a cross-sectional view of a functional layer according to an embodiment of the inventive concepts.

According to an embodiment, the functional layer 300 includes a plurality of layers. For example, the functional layer 300 includes a light blocking layer 310, a heat dissipation layer 320, a cushion layer 330, and a plurality of adhesive layers PSA3 and PSA4, as illustrated in FIG. 8.

According to an embodiment, the light blocking layer 310 is physically coupled to the support member 200 by the second adhesive layer PSA2 interposed therebetween. The light blocking layer 310 prevents components disposed on a rear surface of the display panel 100 from being visible to a user through the display area DA. In addition, the light blocking layer 310 includes a binder and a plurality of pigment particles dispersed in the binder. The pigment particles may include, for example, carbon black.

The flexible display device 1000 according to an embodiment of the inventive concepts includes the functional layer 300 that has the light blocking layer 310, which can improve an impact resistance and a light blocking characteristic of the flexible display device 1000. In addition, the flexible display device 1000 also has improved visibility and improved reliability against external impacts or stress received while in use.

According to an embodiment, the heat dissipation layer 320 is disposed under the light blocking layer 310. The heat dissipation layer 320 is physically coupled to the light blocking layer 310 by a third adhesive layer PSA3 interposed therebetween.

According to an embodiment, the heat dissipation layer 320 effectively discharges heat generated by the display panel 100. The heat dissipation layer 320 includes at least one of, but is not limited to, graphite, copper (Cu), or aluminum (Al), which have excellent heat dissipation characteristics. In addition to improving heat dissipation characteristics, the heat dissipation layer 320 can also shield or absorb electromagnetic energy.

According to an embodiment, the cushion layer 330 includes synthetic resin foam. The cushion layer 330 includes a matrix member MX and a plurality of pores PP. The plurality of pores PP are dispersed in the matrix member MX. The cushion layer 330 is disposed under the heat dissipation layer 320. The cushion layer 330 is physically coupled to the heat dissipation layer 320 by a fourth adhesive layer PSA4 interposed therebetween. The cushion layer 330 is elastic and has a porous structure.

According to an embodiment, the matrix member MX includes a flexible material. For example, the matrix member MX includes a synthetic resin. For example, the matrix member MX may include at least one of acrylonitrile butadienestyrene copolymer (ABS), polyurethane (PU), polyethylene (PE), ethylene vinyl acetate (EVA), or polyvinyl chloride (PVC).

According to an embodiment, the plurality of pores PP can easily absorb an impact applied to the cushion layer 330. The cushion layer 330 has a porous structure with a plurality of pores PP formed in the cushion layer 420. The plurality of pores PP allow the shape of the cushion layer 330 to deform, and thus improving both the elasticity of the cushion layer 330 and the impact resistance of the support member 200. In an embodiment, the cushion layer 330 includes a plurality of synthetic resins. However, embodiments of the inventive concepts are not limited to a specific embodiment.

According to an embodiment, each of the adhesive layers PSA3 and PSA4 is formed by applying and hardening a liquid adhesive material or may be a separately formed adhesive sheet. For example, each of the adhesive layers PSA3 and PSA4 may be formed of a pressure sensitive adhesive (PSA), an optical clear adhesive (OCA), or an optical clear resin (OCR).

However, embodiments of the inventive concepts are not limited to above embodiment. In other embodiments, at least one of the light blocking layer 310, the heat dissipation layer 320 or the cushion layer 330 may be omitted, or the plurality of layers may be provided as a single layer.

FIG. 9 is a flowchart of a method of manufacturing a flexible display device according to an embodiment of the inventive concepts. FIGS. 10A to 10F illustrate a method of manufacturing a flexible display device according to an embodiment of the inventive concepts. Hereinafter, components substantially the same as those described with respect to FIGS. 1 to 4B will be indicated by the same reference numerals or designators, and the descriptions thereof will be omitted.

Referring to FIG. 9, according to an embodiment, a method 2000 of manufacturing a flexible display device includes a process of providing a substrate (S100), a heating process (S200), and a bonding process (S300).

Figure 10A:
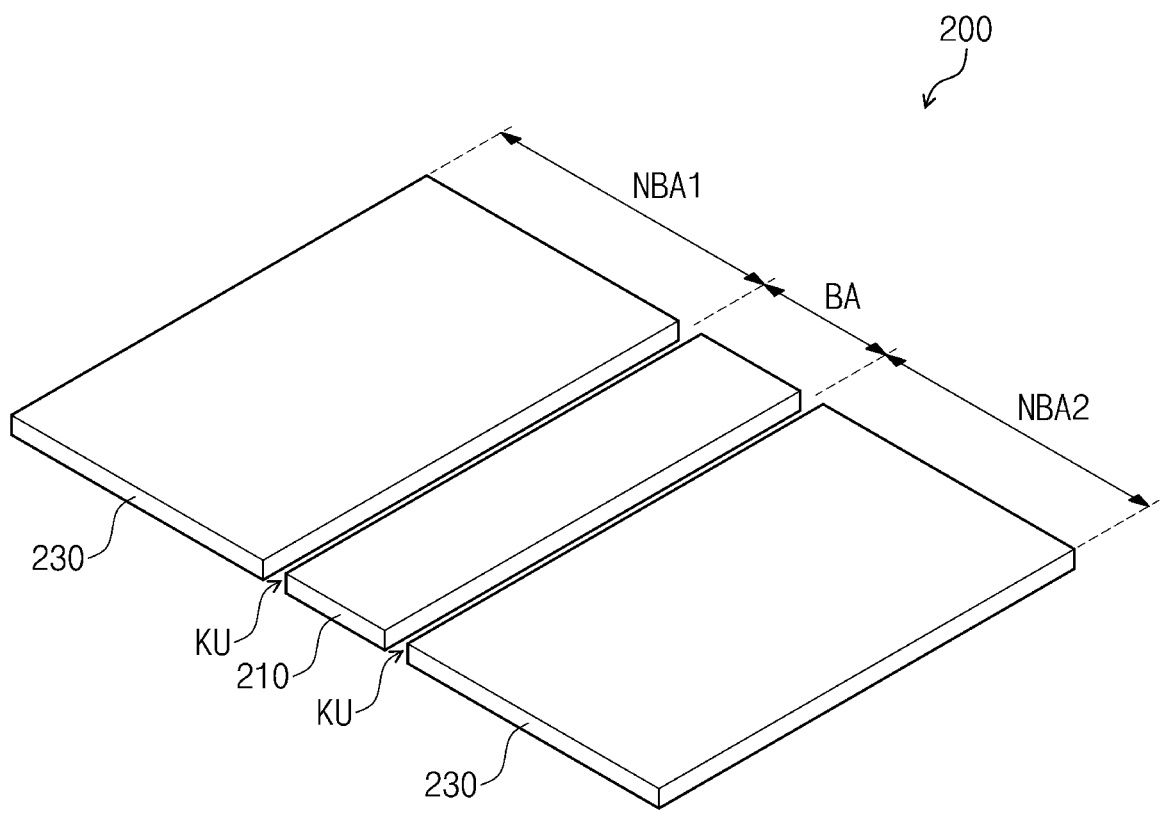
FIGS. 10A to 10F illustrate a method of manufacturing a flexible display device according to an embodiment of the inventive concepts.

According to an embodiment, FIG. 10A illustrates the process S100 of providing a substrate. Referring to FIGS. 9 and 10A, in the process S100 of providing a substrate, a first member 210 is disposed and second members 230 are disposed at both sides of the first member 210. At this time, bonding regions KU are formed corresponding to a space between the first member 210 and the second members 230. In other words, the second members 230 are spaced apart from the first member 210. The first member 210 overlaps the bending area BA. The second members 230 overlap the non-bending areas NBA1 and NBA2, respectively. The first and second members 210 and 230 are included in the substrate.

Figure 10B:
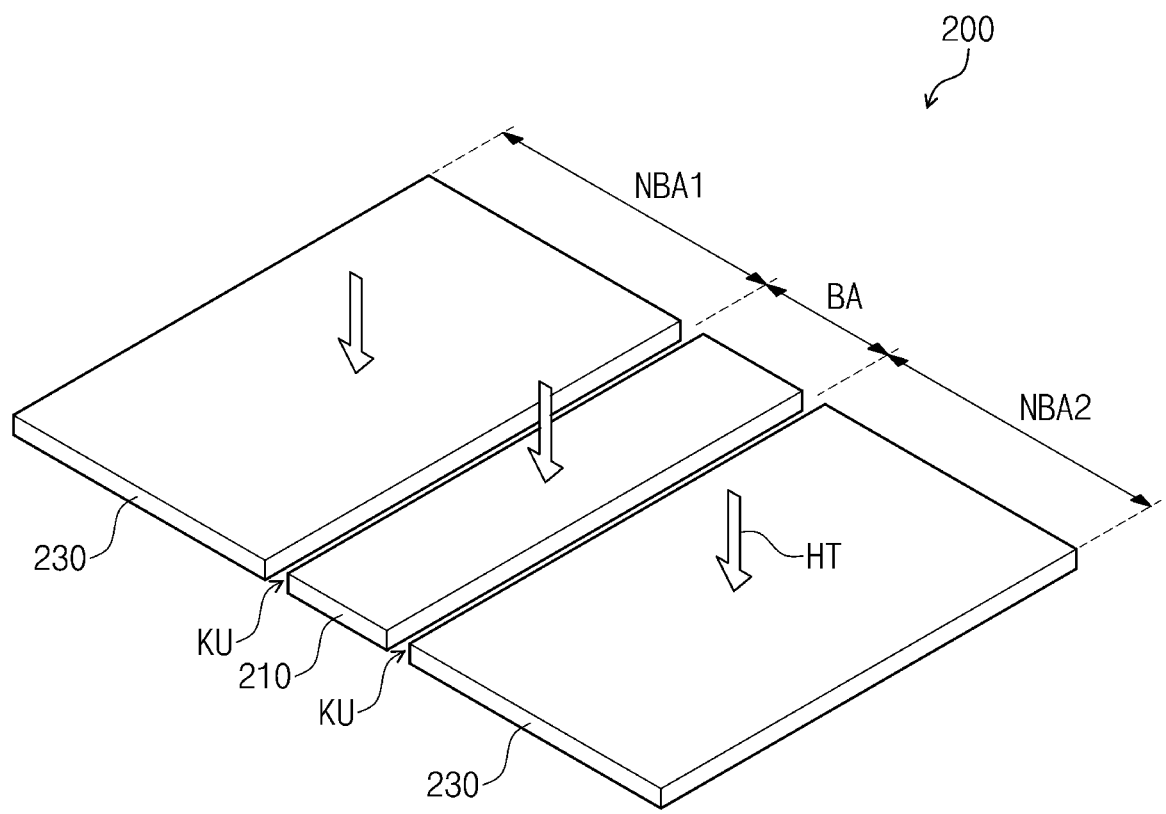

According to an embodiment, FIG. 10B illustrates the heating process S200. Referring to FIGS. 9 and 10B, in the heating process S200, heat HT is applied to the first member 210 and the second members 230. The heating process S200 improves bonding efficiency between a bonding member 220 and each of the first and second members 210 and 230, and thus a bonding metal included in the bonding member 220 perform a capillary action by diffusing into the first and second members 210 and 230.

Figure 10C:
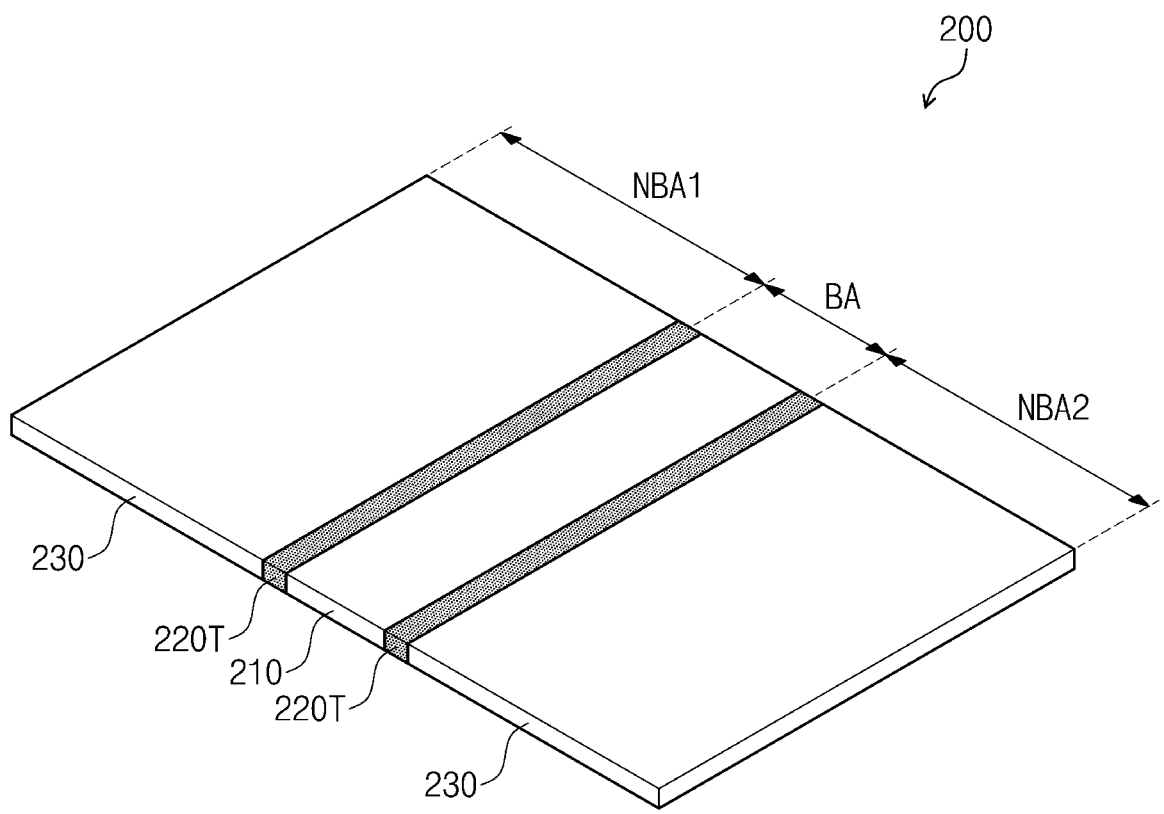

According to an embodiment, FIG. 10C illustrates the bonding process S300. Referring to FIGS. 9 and 10C, in the bonding process S300, a molten bonding metal 220T is disposed in the bonding regions KU. The molten bonding metal 220T includes a metal that can effectively bond with a different kind of a metal. The molten bonding metal 220T has a melting point that is less than those of the first and second members 210 and 230. In other words, the relatively low melting point molten bonding metal 220T is disposed in the bonding regions KU, and thus the bonding process S300 can be performed without damage to the first and second members 210 and 230. As a result, the efficiency of the processes of manufacturing the flexible display device can be improved.

Figure 10D:
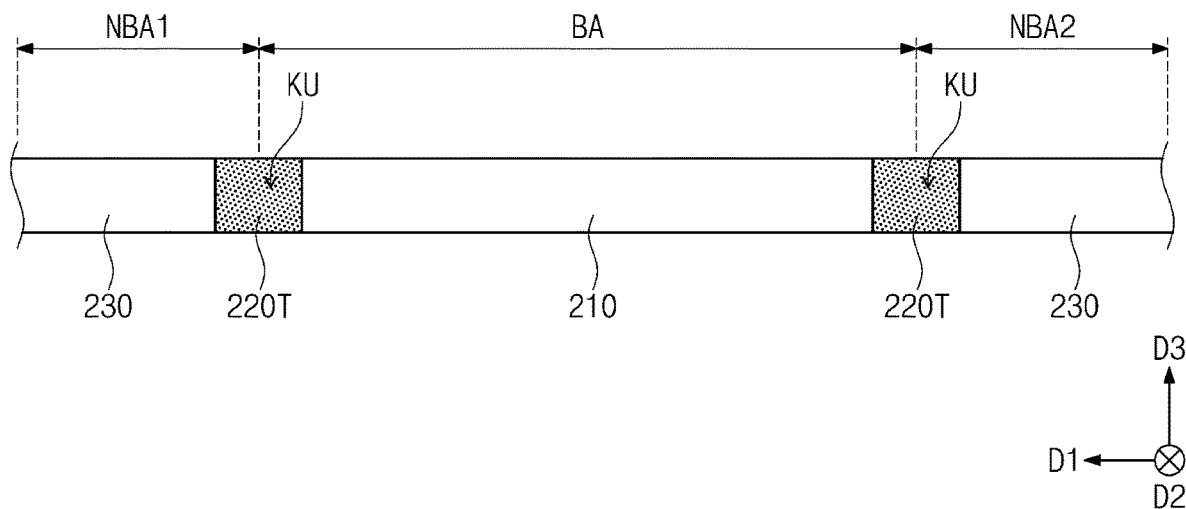
Figure 10E:
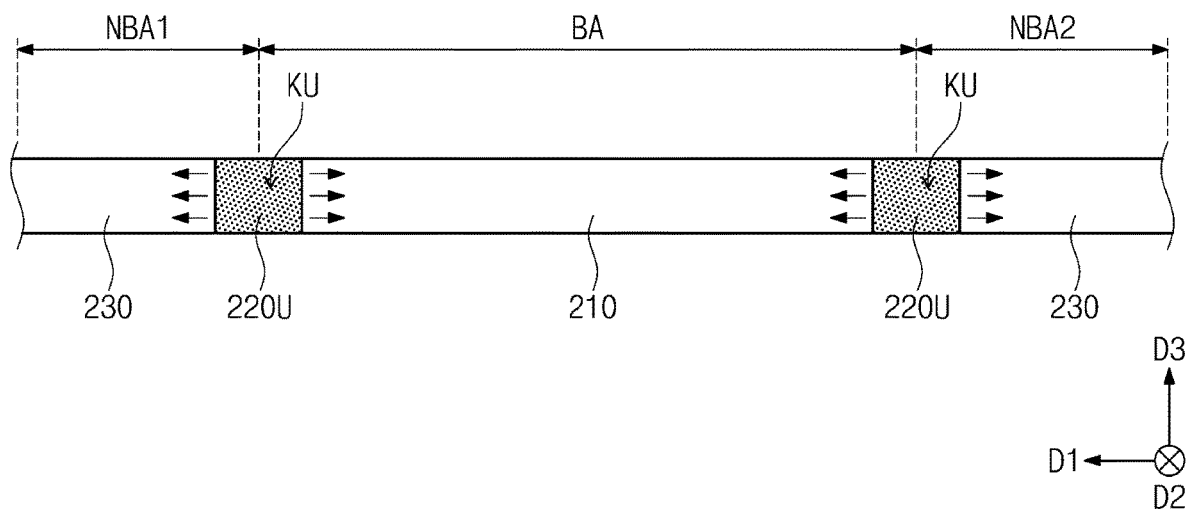
Figure 10F:
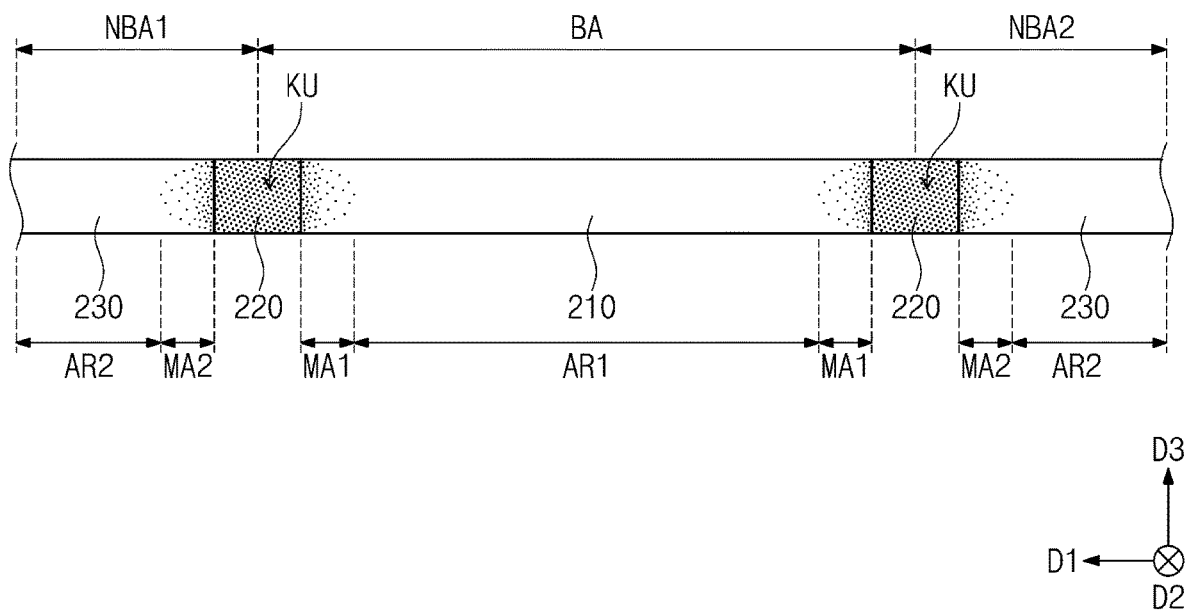

Thereafter, according to an embodiment, referring to FIGS. 10D to 10F, the bonding metal is bonded to the first and second members 210 and 230 to form a support member 200. FIGS. 10D to 10F illustrate a process in which the molten bonding metal 220T diffuses into at least a portion of each of the first and second members 210 and 230 through capillary action over time.

According to an embodiment, bonding between different metals can be performed by a brazing method. Brazing is a technique of bonding metals using a bonding member, such as a bonding member 220, having a lower melting point than that of an object member, such as the first and second members 210 and 230. Brazing can bond different types of metals and reduce material costs. In addition, brazing can easily bond object members having different sizes and thicknesses. In brazing, a molten bonding member is provided to the object members and permeates between the object members due to the bonding member's wettability and capillary action. Wettability can be determined based on an affinity between the melted bonding member and the object member, flux, or atmosphere.

According to an embodiment, capillary action is related to a bonding distance and also to the viscosity and density of the molten bonding member, a position of a bonding surface with respect to gravity, or a heating method.

According to an embodiment, after the molten bonding metal 220T is disposed in the bonding region KU, at least a portion of the molten bonding metal 220T diffuses into the first and second members 210 and 230 due to the wettability between the bonding metal and the members 210 and 230 and to capillary action.

According to an embodiment, after the molten bonding metal 220T has coagulated, the first member 210 further includes the bonding metal. The first member 210 includes a first area AR1 in which no bonding metal is present, and a first mixture area MA1 in which the first metal and the bonding metal are mixed with each other. The first area AR1 and the first mixture area MA1 are arranged in the first direction D1. A concentration of the bonding metal in the first member 210 is greatest at one side of the first member 210 adjacent to the bonding member 220 and progressively decreases from the one side of the first member 210 toward the bending axis AX.

In addition, according to an embodiment, after the molten bonding metal 220T has coagulated, the second member 230 further includes the bonding metal. The second member 230 includes a second area AR2 in which no bonding metal is present, and a second mixture area MA2 in which the second metal and the bonding metal are mixed with each other. The second mixture area MA2 and the second area AR2 are arranged in the first direction D1. A concentration of the bonding metal in the second member 230 is greatest at one side of the second member 230 in contact with the bonding member 220, and decreases with increasing distance from the one side of the second member 230.

According to an embodiment, the bonding metal diffuses into at least a portion of each of the first and second members 210 and 230 due to capillary action to form the mixture areas MA1 and MA2.

Thus, according to an embodiment, after the bonding metal has coagulated, a physical property between the first and second members 210 and 230 gradually changes when viewed in a cross-sectional view. According to embodiments of the inventive concepts, occurrence of wrinkles or interlayer delamination can be prevented by the bonding members 220 that overlap the bending area BA and the non-bending areas NBA1 and NBA2, which improves the reliability of the flexible display device 1000 or 1000A.

According to exemplary embodiments of the inventive concepts, a support member having different metals connected to each other overlaps the bending area and the non-bending area of a flexible display device.

According to exemplary embodiments of the inventive concepts, a metal disposed in the bending area has a modulus or spring back greater than that of a metal of the non-bending area to increase the restoring force. Thus, it is possible to prevent delamination between the adhesive and the display panel or between the adhesive and other component(s). In addition, a decoupling index of the adhesive layers, such as pressure sensitive adhesive (PSA), can be improved. In addition, damage to the elements, such as thin film transistors, organic light emitting elements and a conductive layer, can be prevented even when the flexible display device is bent.

While embodiment of the inventive concepts have been described with reference to exemplary embodiments, it will be apparent to those skilled in the art that various changes and modifications may be made without departing from the spirits and scopes of exemplary embodiments of the inventive concepts. Therefore, it should be understood that the above exemplary embodiments are not limiting, but illustrative. Thus, the scope of embodiments of the inventive concepts is to be determined by a broadest permissible interpretation of the following claims and their equivalents, and shall not be restricted or limited by the foregoing description.

What is claimed is:

1. A flexible display device comprising:
    a display panel that includes a bending area that is bendable about a bending axis that extends in a first direction, and a first non-bending area and a second non-bending area spaced apart from each other in a second direction that intersects the first direction with the bending area interposed therebetween; and
    a support member disposed under the display panel, wherein the support member comprises:
        a first member that overlaps the bending area and that includes a first metal and a first bonding metal with different melting points; and
        a bonding member in contact with one side of the first member and that extends in the first direction, wherein the bonding member includes the same metal as the first bonding metal,
    wherein a concentration of the first bonding metal in the first member progressively decreases from the one side toward the bending axis.

2. The flexible display device of claim 1, wherein a melting point of the first bonding metal is lower than a melting point of the first metal.

3. The flexible display device of claim 2, Wherein the first metal includes at least one of a single metal or an alloy.

4. The flexible display device of claim 2, wherein the support member further comprises:
    a second member that overlaps at least one of the first and second non-bending areas and that is in contact with the bonding member, wherein the second member includes a second bonding metal and a second metal, the second bonding metal is the same as the first bonding metal, and the second metal has a different melting point from the second bonding metal,
    wherein a concentration of the second bonding metal in the second member decreases with increasing distance from the bending axis.

5. The flexible display device of claim 4, wherein a melting point of the second bonding metal is lower than a melting point of the second metal.

6. The flexible display device of claim 4, wherein the second member includes a metal whose thermal conductivity is greater than that of the first member.

7. The flexible display device of claim 4, wherein at least a portion of the first member includes an area formed only of the first metal, and
    wherein at least a portion of the second member includes an area formed only of the second metal.

8. The flexible display device of claim 1, further comprising:
    a functional layer disposed under the support member and that includes at least one of a cushion layer, a light blocking layer, or a heat dissipation layer.

9. The flexible display device of claim 1, wherein the display panel comprises:
    a base layer;
    a circuit layer disposed on the base layer and that includes a plurality of signal lines;
    an element layer that includes an organic light emitting element electrically connected to the circuit layer; and
    an encapsulation layer that covers the element layer.

10. The flexible display device of claim 1, wherein the bonding member has a shape that continuously extends back and forth in the second direction.

11. A flexible display device comprising:
    a display panel that includes a bending area that is bendable about a bending axis that extends in a first direction, and a first non-bending area and a second non-bending area spaced apart from each other in a second direction that intersects the first direction with the bending area interposed therebetween; and
    a support member disposed under the display panel, wherein the support member comprises:
        a first member that overlaps the bending area and that include a bonding metal and a first metal;
        a second member that overlaps at least one of the first and second non-bending areas and that is spaced apart from the first member, wherein the second member includes the bonding metal and a second metal having a different melting point from the bonding metal; and a bonding member that overlaps at least a portion of the bending area and at least a portion of the first and second iron-bending areas, wherein the bonding member is disposed between the first member and the second member and includes the bonding metal, wherein a shape of the bonding member has a pattern that extends in the first direction.

12. The flexible display device of claim 11, wherein a melting point of the bonding metal is lower than those of the first metal and the second metal.

13. The flexible display device of claim 12, wherein the first member has a first modulus, and the second member has a second modulus less than the first modulus.

14. The flexible display device of claim 13, wherein a modulus of the bonding member gradually decreases from the first modulus to the second modulus with increasing distance from the bending axis in the second direction.

15. The flexible display device of claim 11, wherein the pattern oscillates back and forth in the second direction as the pattern extends in the first direction.

16. The flexible display device of claim 15, wherein the pattern is a sinusoidal or semicircular wave shape.

17. The flexible display device of claim 15, wherein the pattern has one of a zigzag shape, a square wave shape, or a stepped zigzag shape.

18. The flexible display device of claim 15, wherein a portion of an amplitude of the pattern overlaps a portion of each of the bending area and the first and second non-bending areas in the first direction when viewed in a plan view.

19. A method of manufacturing a flexible display device, the method comprising:

disposing a first member that includes a first metal, and a second member spaced apart from the first member and that includes a second metal;

applying heat to the first member and the second member; and disposing a molten bonding metal between the first member and the second member to bond the first member and the second member, wherein a concentration of bonding metal decreases in a direction toward the first member at an interface between the first member and the bonding metal, and the concentration of bonding metal decreases in a direction toward the second member at an interface between the second member and the bonding metal.

20. The method of claim 19, wherein the molten bonding metal has a melting point that is less than those of the first member and the second member.

21. The method of claim 19, further comprising:

providing a display panel that includes a bending area that is bendable about a bending axis that extends in a first direction, and a first non-bending area and a second non-bending area spaced apart from each other in a second direction that intersects the first direction with the bending area interposed therebetween; and coupling the first member and the second member coupled with the bonding metal to the display panel, wherein the first member overlaps the bending area, and the second member overlaps the first non-bending area and the second non-bending area.

* * * * *